US010622420B2

(12) United States Patent
Choi et al.

(10) Patent No.: US 10,622,420 B2
(45) Date of Patent: Apr. 14, 2020

(54) FOLDABLE DISPLAY DEVICE INCLUDING SPACERS IN FOLDING AREA

(71) Applicant: LG Display Co., Ltd., Seoul (KR)

(72) Inventors: Suk Choi, Hwaseong-si (KR); NohJin Myung, Paju-si (KR); Wansoo Lee, Paju-si (KR); Sinchul Kang, Goyang-si (KR); Seungkyu Lee, Bucheon-si (KR); Miyeon Seo, Asan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/033,084

(22) Filed: Jul. 11, 2018

(65) Prior Publication Data

US 2019/0165060 A1    May 30, 2019

(30) Foreign Application Priority Data

Nov. 28, 2017 (KR) .................. 10-2017-0160351

(51) Int. Cl.
*H01L 27/32* (2006.01)
*H01L 51/52* (2006.01)
*H01L 51/00* (2006.01)

(52) U.S. Cl.
CPC ...... *H01L 27/3246* (2013.01); *H01L 51/0097* (2013.01); *H01L 51/525* (2013.01); *H01L 51/5253* (2013.01); *H01L 2251/5338* (2013.01)

(58) Field of Classification Search
CPC ............................................. H01L 2251/5338
See application file for complete search history.

(56) References Cited

U.S. PATENT DOCUMENTS

| 2015/0192951 A1* | 7/2015 | Chong ............... G06F 1/1601 |
| | | 359/894 |
| 2016/0037656 A1 | 2/2016 | Kim et al. |
| 2016/0240817 A1 | 8/2016 | Cho et al. |
| 2019/0006449 A1* | 1/2019 | Wu ................. H01L 51/0097 |

FOREIGN PATENT DOCUMENTS

| KR | 10-2015-0043970 A | 4/2015 |
| KR | 10-2017-0128741 A | 11/2017 |

OTHER PUBLICATIONS

European Patent Office, Extended European Search Report and Opinion, EP Patent Application No. 18207830.3, dated Aug. 29, 2019, eight pages.

* cited by examiner

*Primary Examiner* — Daniel Whalen
(74) *Attorney, Agent, or Firm* — Fenwick & West LLP

(57) ABSTRACT

A foldable display device includes a display panel configured to be folded around a folding axis. The display panel includes spacers disposed in a non-folding area and a folding area, and the spacers may have different sizes or densities. Dimensions of the spacers may be in a direction of the folding axis or intersect the direction of the folding axis. The display panel also includes pixels in an active area that overlap with the spacers, which may help reduce peeling, cracking, defects, or reduction in pixel brightness due to folding of the display device.

24 Claims, 15 Drawing Sheets

FOLDABLE DISPLAY DEVICE INCLUDING SPACERS IN FOLDING AREA

CROSS-REFERENCE TO RELATED APPLICATION

This application claims priority under 35 U.S.C. § 119(a) of Republic of Korea Patent Application No. 10-2017-0160351, filed on Nov. 28, 2017, which is incorporated herein by reference in its entirety.

BACKGROUND

Technical Field

The present disclosure relates to a foldable display device including a spacer stabilization structure in a folding area.

Description of the Related Art

Image display devices that realize various information on the screen become core technologies of the information communication era. Examples of the image display devices include a cathode ray display panel, a liquid crystal display panel, an electrophoretic display panel, an organic light emitting display panel, and the like.

As a means for implementing a thinner, lighter and portable image display device with higher performance, an organic light emitting display panel has been attracting a lot of attention. The organic light emitting display panel is configured to display an image by controlling the amount of light emitted from an organic light emitting element.

The organic light emitting display panel is a self-emitting display panel implemented without a separate light source and thus can be manufactured into a lightweight and thin form. Further, the organic light emitting display panel can be easily implemented as a foldable display device by placing a thin film transistor and an organic light-emitting layer on a foldable substrate.

The organic light emitting display panel implemented as a foldable display device may be vulnerable to external shocks. Particularly when the foldable display device is folded, the organic light-emitting layer may be peeled and cracked in the vicinity of a folding area due to low adhesive strength of the organic light-emitting layer.

In a conventional organic light emitting display panel, a spacer is positioned in a non-emission area. Therefore, it is possible to protect the organic light-emitting layer by suppressing peeling of the organic light-emitting layer caused by external shocks generated when the foldable display device is folded.

However, when the foldable display device is folded, the organic light emitting display panel may be applied with a folding stress by the folding. If the organic light emitting display panel is continuously applied with a stress by repeated folding, the spacer in the organic light emitting display panel may be cracked. Therefore, the cracked spacer serves as a particle and may cause a dark spot in the organic light-emitting layer, which is undesirable. The dark spot in the organic light-emitting layer may decrease the brightness of the foldable display device.

SUMMARY

An object to be achieved by the present disclosure is to provide a foldable display device in which an organic light emitting display panel includes a spacer and the occurrence of a crack in the spacer can be suppressed. In an embodiment, a foldable display device includes a display panel configured to be folded around a folding axis. The display panel includes a first plurality of spacers disposed in a non-folding area. Additionally, the display panel includes a second plurality of spacers disposed in a folding area, where the second plurality of spacers have different sizes than the first plurality of spacers. Each of the second plurality of spacers has a first dimension and a second dimension greater than the first dimension. The second dimensions of the second plurality of spacers are each in a direction of the folding axis. In some embodiments, the second dimension of each spacer of the second plurality of spacers is the greatest dimensions of said each spacer. In some embodiments, the first dimension of each spacer of the second plurality of spacers is the smallest dimensions of said each spacer, where the first dimensions each intersect the direction of the folding axis.

In another embodiment, a foldable display device includes a display panel configured to be folded around a folding axis. The display panel includes a first plurality of spacers disposed in a non-folding area. Additionally, the display panel includes a second plurality of spacers disposed in a folding area, where a first density of the first plurality of spacers is less than a second density of the second plurality of spacers.

In another embodiment, a foldable display device includes a display panel configured to be folded around a folding axis. The display panel includes a first plurality of spacers disposed in a non-folding area. Additionally, the display panel includes a second plurality of spacers disposed in a folding area, where the second plurality of spacers has different size or density than the first plurality of spacers. The display panel also includes a plurality of pixels disposed in an active area. Each of the plurality of pixels overlaps with at least one of the first plurality of spacers or the second plurality of spacers.

Objects of the present disclosure are not limited to the above-mentioned objects, and other objects, which are not mentioned above, can be clearly understood by those skilled in the art from the following descriptions.

The objects to be achieved by the present disclosure, the aspects, and the effects of the present disclosure described above do not specify essential features of the claims, and, thus, the scope of the claims is not limited to the present disclosure.

BRIEF DESCRIPTION OF THE DRAWINGS

The above and other aspects, features, and other advantages of the present disclosure will be more clearly understood from the following detailed description taken in conjunction with the accompanying drawings.

DETAILED DESCRIPTION

Figure 1:
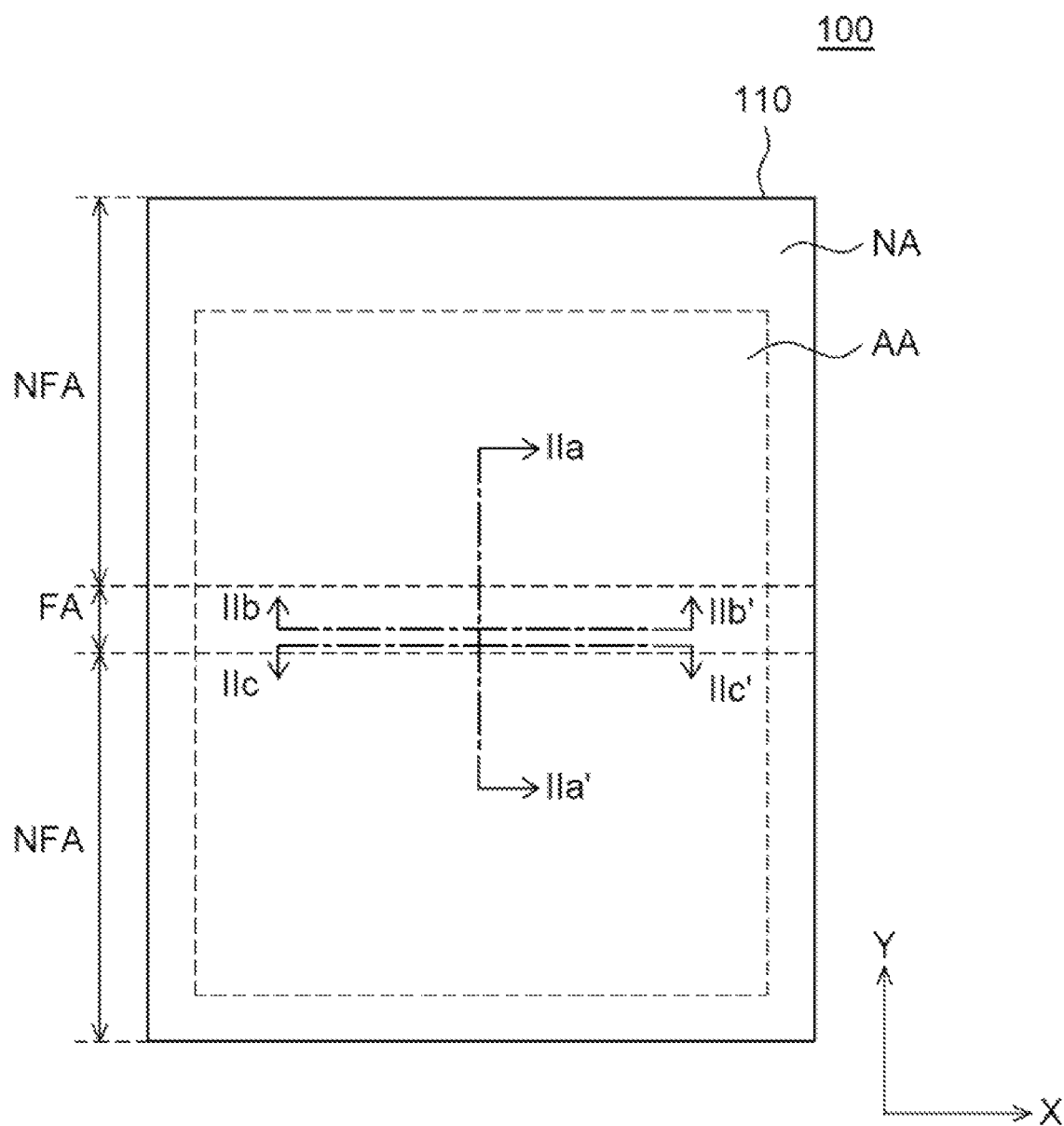
FIG. 1 is a plan view of a foldable display device according to an exemplary embodiment of the present disclosure.

The advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but may be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification and drawings. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," or "next," one or more parts may be positioned between the two parts unless the terms are used with the term "immediately" or "directly." When an element or layer is referred to as being "on" another element or layer, it may be directly on the other element or layer, or intervening elements or layers may be present. It is to be understood that when one element is referred to as being "connected to" or "coupled to" another element, it may be directly connected to or directly coupled to another element, connected to or coupled to another element, having still another element "intervening" in between, or "connected to" or "coupled to" another element via still another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Throughout the specification, the same reference numerals denote the same elements.

The size and thickness of each component illustrated in the drawings are represented for convenience of explanation, and the present disclosure is not necessarily limited to the illustrated size and thickness of each component.

The features of various embodiments of the present disclosure can be partially or entirely adhered to or combined with each other and can be interlocked and operated in technically various ways as understood by those skilled in the art, and the embodiments can be carried out independently of or in association with each other.

Hereinafter, the present disclosure will be described in detail with reference to the accompanying drawings.

FIG. 1 is a plan view of a foldable display device according to an exemplary embodiment of the present disclosure. FIG. 1 illustrates an organic light emitting display panel 110 from among various components of a foldable display device 100 for convenience in explanation.

The organic light emitting display panel 110 is configured to display an image. In the organic light emitting display panel 110, an organic light emitting element for displaying an image, a circuit for driving the organic light emitting element, lines, and other components may be disposed.

The organic light emitting display panel 110 includes an active area AA, a non-active area NA, a folding area FA, and a non-folding area NFA.

The active area AA is configured to display an image, and a plurality of pixels composed of organic light emitting elements is arrayed in the active area AA. An organic light emitting element for displaying an image and a circuit unit for driving the organic light emitting element may be disposed in the active area AA. In the present disclosure, for convenience in explanation, the foldable display device 100 including the organic light emitting display panel 110 including organic light emitting elements is described, but the present disclosure is not limited thereto.

The circuit unit may include various thin film transistors, a capacitor, and lines for driving the organic light emitting element. For example, the circuit unit may include various components such as a driving thin film transistor, a switching thin film transistor, a storage capacitor, a gate line, and a data line, but may not be limited thereto.

The non-active area NA refers to an area where an image is not displayed, and a circuit, lines, and other components for driving the organic light emitting element in the active area AA are disposed in the non-active area NA. Further, various ICs such as a gate driver IC, a data driver IC, and a driving circuit may be disposed in the non-active area NA. For example, the various ICs and the driving circuit may be mounted on the non-active area NA of the organic light emitting display panel 110 through a gate in panel (GIP)

method. As another example, the various ICs and the driving circuit may be connected to the organic light emitting display panel 110 through a tape carrier package (TCP) or chip on film (COF) method.

The organic light emitting display panel 110 may be defined into the active area AA and the non-active area NA, or may also be defined into the folding area FA and the non-folding area NFA.

The folding area (or folding unit) FA refers to a folded area of the organic light emitting display panel 110 when the foldable display device 100 is folded. The folding area FA may include a part of the active area AA and a part of the non-active area NA. In the present disclosure, the folding area FA is described as including a part of the active area AA and a part of the non-active area NA, but may not be limited thereto. The non-active area NA may be present only in an area outside the active area AA. Therefore, in some embodiments, the folding area FA may include only a part of the active area AA.

The folding area FA may be folded with a specific radius of curvature around a folding axis. In the embodiment shown in FIG. 1, the folding axis may be an X-axis. In the case where the folding area FA is folded around the folding axis, the folding area FA may form a part of a circle or oval. In this case, the radius of curvature of the folding area FA refers to the radius of a circle or oval corresponding to the part of the circle or oval formed by the folding area FA. In some embodiments, the folding axis is described as positioned in the folding area FA in an X-axis direction and the non-folding area NFA is described as extended from the folding area FA in a Y-axis direction and intersecting the x-axis direction, for example, perpendicular to the folding axis. However, the present disclosure is not limited thereto.

The non-folding area (or non-folding unit) NFA refers to a non-folded area of the organic light emitting display panel 110 when the foldable display device 100 is folded. That is, the non-folding area NFA refers a flat area of the organic light emitting display panel 110 when the foldable display device 100 is folded. The non-folding area NFA may include a part of the active area AA and a part of the non-active area NA.

The non-folding area NFA may be positioned on both sides of the folding area FA. That is, the non-folding area NFA may refer to an area extended in the Y-axis direction based on the folding axis. Herein, the folding area FA may be defined between the non-folding areas NFA. Therefore, when the organic light emitting display panel 110 is folded around the folding axis, the non-folding areas NFA may face each other.

Hereinafter, the foldable display device 100 will be described in more detail with reference to FIG. 2A to FIG. 2C.

Figure 2A:
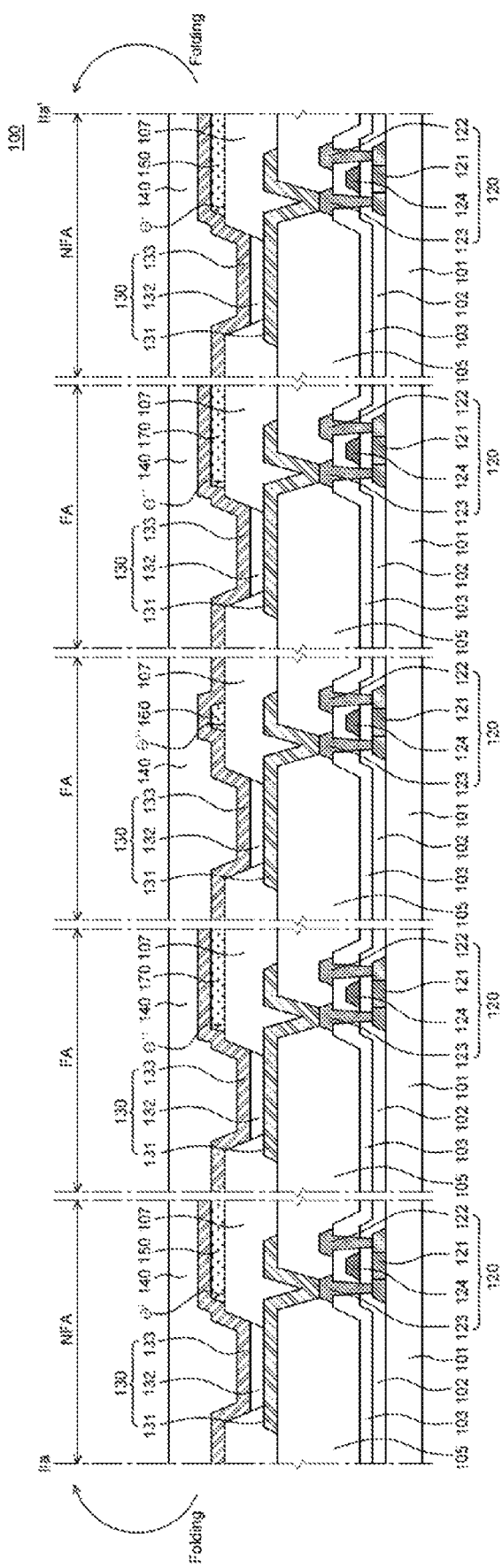
FIG. 2A is a cross-sectional view taken along a line IIa-IIa' of FIG. 1, according to an embodiment.

FIG. 2A is a cross-sectional view taken along a line IIa-IIa' of FIG. 1, according to an embodiment. FIG. 2B is a cross-sectional view taken along a line IIb-IIb' of FIG. 1, according to an embodiment. FIG. 2C is a cross-sectional view taken along a line IIc-IIc' of FIG. 1, according to an embodiment. FIG. 2A is a cross-sectional view of the foldable display device 100 in the Y-axis direction, and FIG. 2B and FIG. 2C are cross-sectional views of the foldable display device 100 in the X-axis direction.

Figure 2B:
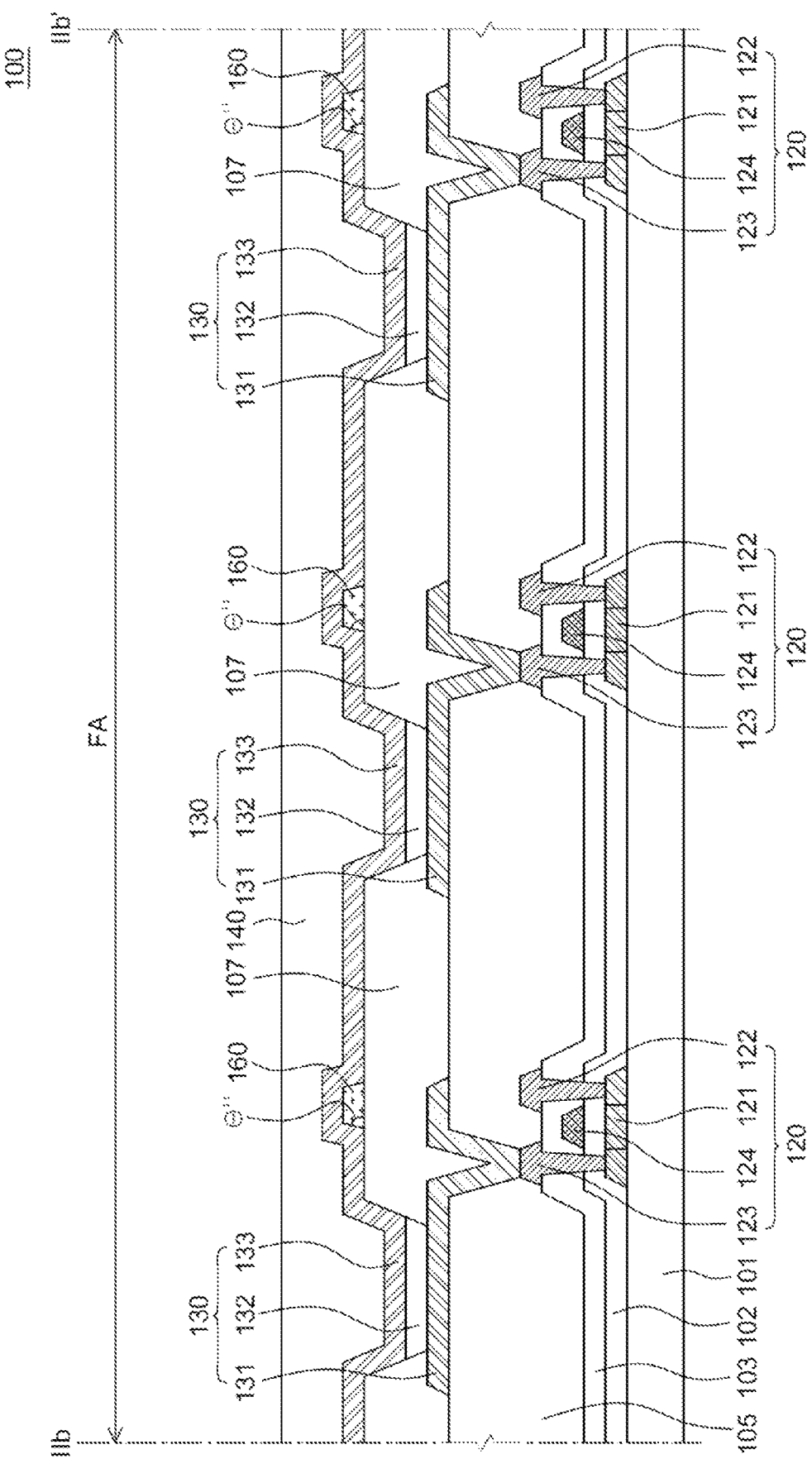
FIG. 2B is a cross-sectional view taken along a line IIb-IIb' of FIG. 1, according to an embodiment
Figure 2C:
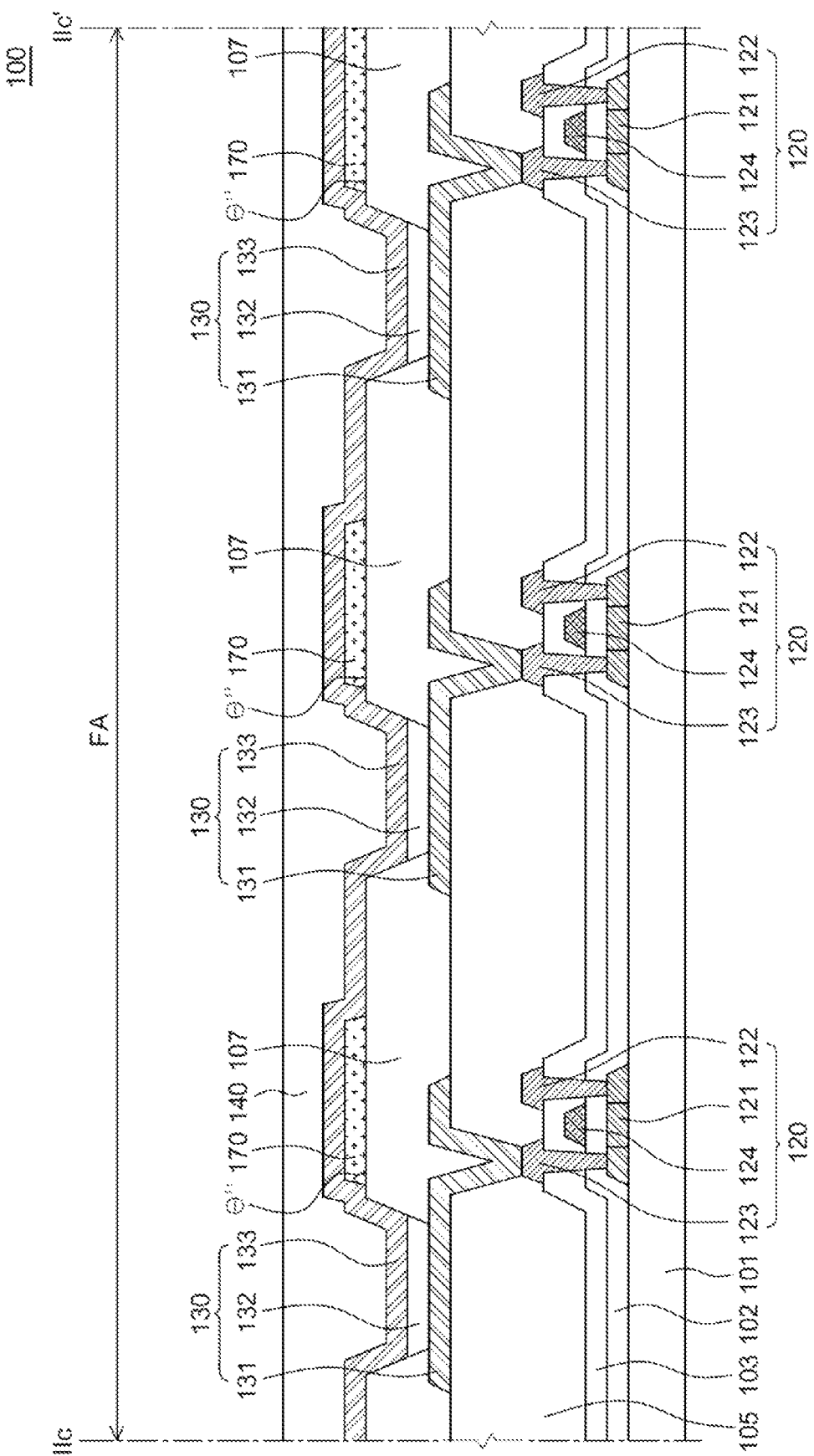
FIG. 2C is a cross-sectional view taken along a line IIc-IIc' of FIG. 1, according to an embodiment

The foldable display device 100 according to an exemplary embodiment of the present disclosure as illustrated in FIG. 2A to FIG. 2C is the top-emission type foldable display device 100 in which light emitted from an organic light emitting element 130 of the organic light emitting display panel 110 is released to an upper part of the organic light emitting display panel 110 through a cathode. However, the present disclosure is not limited to the top-emission type foldable display device 100, but can be applied to bottom-emission type and dual side-emission type foldable display devices.

A substrate 101 is configured to support various components of the foldable display device 100. The substrate 101 may be formed of a plastic material having flexibility and thus may be a flexible substrate 101 which is foldable. Herein, when the substrate 101 is folded around the folding axis, the foldable display device 100 can be folded. For example, in the case where the substrate 101 is formed of polyimide (PI), a supporting substrate formed of glass is disposed under the substrate 101 during a manufacturing process of the substrate 101. After the manufacturing process of the substrate 101, the supporting substrate may be released. Further, after the supporting substrate is released, a back plate for supporting the substrate 101 may be disposed under the substrate 101. The substrate 101 which can be applied to the foldable display device 100 may be formed of other materials having flexibility in addition to the plastic material as long as the materials are not cracked even when the foldable display device 100 is repeatedly folded.

A thin film transistor 120 is disposed on the substrate 101. The thin film transistor 120 includes an active layer 121 formed of poly-silicon, a gate electrode 124, a source electrode 122, and a drain electrode 123. The thin film transistor 120 has a top-gate structure in which the gate electrode 124 is disposed on the active layer 121. For convenience in explanation, FIG. 2A to FIG. 2C illustrate a driving thin film transistor from among various thin film transistors which can be included in the foldable display device 100. However, other thin film transistors such as a switching thin film transistor may also be included in the foldable display device 100. Further, in the present disclosure, the thin film transistor 120 has been described as having a coplanar structure. However, the thin film transistor 120 may be implemented as having another structure such as a staggered structure. Furthermore, the thin film transistor 120 is illustrated as disposed on the substrate 101 in FIG. 2A to FIG. 2C. However, the present disclosure is not limited thereto. A multi-buffer layer may be disposed between the substrate 101 and the thin film transistor 120 based on a type or material of the substrate 101 and the structure and type of the thin film transistor 120.

The active layer 121 of the thin film transistor 120 is disposed on the substrate 101. The active layer 121 includes a channel region, in which a channel is formed when the thin film transistor 120 is driven, and a source region and a drain region on the sides of the channel region. The channel region, the source region, and the drain region may be defined by ion doping (impurity doping).

The active layer 121 of the thin film transistor 120 may be formed of poly-silicon. Thus, an amorphous silicon (a-Si) material is deposited on the substrate 101 and poly-silicon is formed by performing one or more of a dehydrogenation process, a crystallization process, an activation process, and a hydrogenation process thereto. The active layer 121 may be formed by patterning the poly-silicon. If the active layer 121 is formed of poly-silicon, the thin film transistor 120 may be a LTPS thin film transistor 120 formed of low temperature poly-silicon (LTPS). A poly-silicon material has high mobility. Thus, if the active layer 121 is formed of poly-silicon, it has advantages such as low energy consumption and excellent reliability.

In other embodiments, the active layer 121 of the thin film transistor 120 may be formed of an oxide semiconductor material. The active layer 121 of the thin film transistor 120 may be formed of a metal oxide such as Indium Gallium Zinc Oxide (IGZO), but may not be limited thereto. The oxide semiconductor material has a higher band gap than a silicon material. Therefore, electrons cannot pass the band gap in an off state, and, thus, an off-current is low.

A gate insulating layer 102 is disposed on the active layer 121. The gate insulating layer 102 may be formed as a single layer of an inorganic material such as silicon nitride (SiNx) or silicon oxide (SiOx) or a multi-layer of silicon nitride (SiNx) or silicon oxide (SiOx). In the gate insulating layer 102, a source electrode 122 and a drain electrode 123 include contact holes for contact with the source region and the drain region, respectively, of the active layer 121. For convenience in explanation, FIG. 2A to FIG. 2C illustrate the gate insulating layer 102 as planarized. However, the gate insulating layer 102 may be formed along shapes of the components disposed under the gate insulating layer 102.

A gate electrode 124 is disposed on the gate insulating layer 102. The gate electrode 124 is formed by forming a metal layer such as molybdenum (Mo) on the gate insulating layer 102 and then patterning the metal layer. The gate electrode 124 is disposed on the gate insulating layer 102 so as to be overlapped with the channel region of the active layer 121.

An interlayer insulating layer 103 is disposed on the gate electrode 124. The interlayer insulating layer 103 may be formed as a single layer of an inorganic material such as silicon nitride (SiNx) or silicon oxide (SiOx) or a multi-layer of silicon nitride (SiNx) or silicon oxide (SiOx). In the interlayer insulating layer 103, the source electrode 122 and the drain electrode 123 include contact holes for contact with the source region and the drain region, respectively, of the active layer 121. For convenience in explanation, FIG. 2A to FIG. 2C illustrate the interlayer insulating layer 103 as planarized. However, the interlayer insulating layer 103 may be formed along shapes of the components disposed under the interlayer insulating layer 103.

The source electrode 122 and the drain electrode 123 are disposed on the interlayer insulating layer 103. The source electrode 122 and the drain electrode 123 may be formed of a conductive metal material and may have, for example, a three-layer structure of titanium (Ti), aluminum (Al), and titanium (Ti). The source electrode 122 and the drain electrode 123 may be connected to the source region and the drain region, respectively, of the active layer 121 through the contact holes included in the gate insulating layer 102 and the interlayer insulating layer 103.

A planarization layer (or first insulating layer) 105 is disposed on the thin film transistor 120. Herein, the planarization layer 105 may cover and protect the thin film transistor 120. Further, the planarization layer 105 may planarize an upper part of the thin film transistor 120, and thus, the organic light emitting element 130 can be formed with more reliability. Herein, the planarization layer 105 may include a contact hole for contact of an anode 131 of the organic light emitting element 130 with the thin film transistor 120.

The organic light emitting element 130 is disposed on the planarization layer 105. The organic light emitting element 130 includes the anode electrode 131 formed on the planarization layer 105 and electrically connected to the source electrode 122 of the thin film transistor 120. Further, the organic light emitting element 130 includes an organic light-emitting layer 132 disposed on the anode electrode 131 and a cathode electrode 133 formed on the organic light-emitting layer 132. Herein, the anode electrode 131 may be formed on the planarization layer 105 and electrically connected to the thin film transistor 120 through a contact hole included in the planarization layer 105. In the embodiment shown in FIG. 2A, the foldable display device 100 is implemented as a top-emission type. Therefore, the anode electrode 131 may include a reflective layer configured to reflect light emitted from the organic light-emitting layer 132 toward the cathode 133 and a transparent conductive layer configured to supply holes to the organic light-emitting layer 132. In some embodiments, the anode electrode 131 may include only the transparent conductive layer, and the reflective layer may be defined as a component separate from the anode electrode 131.

The organic light-emitting layer 132 is configured to emit light of a specific color and may include one of a red organic light-emitting layer, a green organic light-emitting layer, a blue organic light-emitting layer, and a white organic light-emitting layer. If the organic light-emitting layer 132 includes a white organic light-emitting layer, a color filter configured to convert a white light emitted from the white organic light-emitting layer into another color light may be disposed on the organic light emitting element 130. The organic light-emitting layer 132 may further include various organic layers and/or inorganic layers such as a hole transport layer, a hole injection layer, an electron injection layer, and an electron transport layer.

The cathode 133 may be formed of a transparent conductive material. For example, the cathode 133 may be formed including a transparent conductive oxide such as Indium Zinc Oxide (IZO) or ytterbium (Yb).

An encapsulation unit 140 may be laminated on the cathode 133. Herein, the encapsulation unit 140 may have a structure in which an inorganic layer and an organic layer are laminated alternately. Therefore, the encapsulation unit 140 may protect the organic light emitting element 130 from moisture and/or oxygen by suppressing exposure of the organic light emitting element 130 to moisture and/or oxygen.

A bank (or second insulating layer) 107 is disposed on the anode electrode 131 and the planarization layer 105. Herein, the bank 107 is positioned on the planarization layer 105 and may cover a part of an outer periphery of the anode electrode 131 and the contact hole included in the planarization layer 105. The bank 107 is positioned adjacent to pixels disposed in the active area AA and thus separates the pixels. Thus, the bank 107 is considered as defining each pixel region. The bank 107 may be formed of an organic material. For example, the bank 107 may be formed of polyimide, acryl, or benzocyclobutene (BCB)-based resin, but may not be limited thereto.

Spacers 150, 160, and 170 are disposed on the bank 107. An array of the spacers 150, 160, and 170 may be positioned between pixels composed of the organic light emitting elements 130. Herein, the spacers 150, 160, and 170 may be positioned adjacent to the organic light-emitting layer 132. The spacers 150, 160, and 170 may protect the organic light-emitting layer 132 against external shocks when the foldable display device 100 is folded. Therefore, the spacers 150, 160, and 170 can suppress the occurrence of lifting caused by low adhesive strength of the organic light-emitting layer 132. Therefore, the spacers 150, 160, and 170 can suppress peeling of the organic light-emitting layer 132.

Among the spacers 150, 160, and 170, the spacers 160 and 170 in the folding area FA may be different from the spacers 150 in the non-folding area NFA in at least one of shape, number, position, density, and area size. For example, spacers in the non-folding area NFA may have a first density different than a second density of spacers in the folding area FA. In some embodiments, the second density is at least twice the first density. Herein, the dual-function spacers 160 and 170 may be disposed in the folding area FA. The dual-function spacers 160 and 170 enable the improvement of easiness in folding and the suppression of a decrease in brightness of the foldable display device 100.

As illustrated in FIG. 2A, the spacer 150 disposed in the non-folding area NFA may be different from the dual-function spacers 160 and 170 disposed in the folding area FA in structure and placement. As the dual-function spacers 160 and 170 are closer to the folding axis of the folding area FA, at least one of the shape, number, position, density and area size thereof may be different.

Specifically, in the spacer 150 disposed in the non-folding area NFA, the largest dimension of the spacer 150 is extended in a direction intersecting the folding axis (e.g., perpendicular to the folding axis). For example, the spacer 150 having a rectangular shape disposed in the non-folding area NFA has a width extended in the Y-axis direction (e.g., perpendicular to the folding axis) and a length extended in the X-axis direction, where the width is greater than the length. In contrast, in the dual-function spacers 160 and 170 disposed in the folding area FA, the smallest dimensions of the dual-function spacers 160 and 170 are extended in a direction intersecting with (e.g., perpendicular to) the folding axis.

Further, as illustrated in FIG. 2B and FIG. 2C, in the dual-function spacers 160 and 170 disposed in the folding area FA, the largest dimensions of the dual-function spacers 160 and 170 are extended in the same direction as the folding axis, e.g., the x-axis. Herein, a first dual-function spacer 160 and a second dual-function spacer 170 may have different lengths and/or widths. For example, the width of the first dual-function spacer 160 extended in the folding axis may have a smaller length than the width of the second dual-function spacer 170 extended in the folding axis.

In the dual-function spacers 160 and 170, another dimension intersecting the dimension having the smallest length may have the greatest length. In this case, the dimension having the smallest length in the dual-function spacers 160 and 170 is in a direction intersecting with the folding axis, for example, a minor axis that is perpendicular to the folding axis. Also, the other dimension having the greatest length in the dual-function spacers 160 and 170 is in the direction of the folding axis, for example, a major axis parallel to or aligned with the folding axis. Therefore, the intersecting minor and major axes of the dual-function spacers 160 and 170 may intersect (e.g., be perpendicular to) each other. That is, the dual-function spacers 160 and 170 disposed in the folding area FA may be extended in the X-axis direction and have the greatest dimension in the X-axis direction and the shortest dimension in the Y-axis direction. Herein, the dual-function spacers 160 and 170 disposed in the folding area FA need to protect the organic light-emitting layer 132 without being cracked by external shocks. Therefore, the width of the dual-function spacers 160 and 170 in the Y-axis direction should be, for example, at least 2 μm. Further, a height of the dual-function spacers 160 and 170 should be less than a height of the encapsulation unit 140. For example, if the encapsulation unit 140 has a height of 3.5 μm, the dual-function spacers 160 and 170 may have a height of 3 μm.

The substrate 101 is folded around the folding axis of the folding area FA and thus can be elongated in the Y-axis direction. The smallest dimensions of the dual-function spacers 160 and 170 may be in an elongation direction of the folded substrate 101. That is, the minor axes of the dual-function spacers 160 and 170 may have the same direction as the elongation direction of the folded substrate 101. Therefore, the elongation of the dual-function spacers 160 and 170 in the Y-axis direction can be reduced or minimized. That is, when the substrate 101 is folded around the folding axis of the folding area FA, the elongation of the dual-function spacers 160 and 170 can be reduced or minimized. Therefore, when the foldable display device 100 is folded, a folding stress applied to the dual-function spacers 160 and 170 can be reduced or minimized.

The dual-function spacers 160 and 170 disposed in the folding area FA and the spacer 150 disposed in the non-folding area NFA may be tapered spacers. A tapered spacer refers to a trapezoid-shaped spacer when viewed from one side, and a reverse tapered spacer refers to a reversed trapezoid-shaped spacer when viewed from one side. During a deposition process of the tapered spacer, the generation of a particle can be reduced or minimized as compared with the reverse tapered spacer. Therefore, the dual-function spacers 160 and 170 disposed in the folding area FA and the spacer 150 disposed in the non-folding area NFA can be formed as tapered spacers by the same process. That is, the dual-function spacers 160 and 170 disposed in the folding area FA and the spacer 150 disposed in the non-folding area NFA may have the same shape.

Further, the reversed trapezoid-shaped reverse tapered spacer has an increasing area size toward its top but may be decreased in thickness as compared with the trapezoid-shaped tapered spacer. When the foldable display device 100 is folded, an end of the reverse tapered spacer may be cracked by a folding stress applied to the spacer. Therefore, the reverse tapered spacer may generate a particle due to a crack in the spacer caused by a folding stress. The tapered spacer has an increasing thickness of an end toward its top, and thus, a crack in a spacer caused by a folding stress can be reduced or minimized. Therefore, the tapered spacer can reduce or minimize the generation of a particle. The dual-function spacer 160 disposed in the folding area FA may be a trapezoid-shaped spacer when the foldable display device 100 is viewed from one side. Therefore, the dual-function spacers 160 and 170 disposed in the folding area FA may be tapered spacers, and thus, a folding stress can be reduced or minimized.

The greatest base angle θ" of the dual-function spacers 160 and 170 may be greater than the greatest base angle θ' of the spacer 150 disposed in the non-folding area NFA. In some embodiments, upper surfaces of the dual-function spacers 160 and 170 disposed in the folding area FA may have greater area sizes than an upper surface of the spacer 150 disposed in the non-folding area NFA. When the foldable display device 100 is folded, a folding stress is transmitted to the upper surfaces of the dual-function spacers 160 and 170. Herein, a folding stress applied to a unit area size of the dual-function spacers 160 and 170 is in inverse proportion to area sizes of the upper surfaces of the dual-function spacers 160 and 170. Therefore, as the area sizes of the upper surfaces of the dual-function spacers 160 and 170 are increased, the folding stress can be dispersed. That is, the area sizes of the upper surfaces of the dual-function spacers 160 and 170 disposed in the folding area FA may be set to be greater than an area size of the upper surface of the spacer 150 disposed in the non-folding area NFA. Thus, the folding stress can be dispersed. Herein, if the dual-function spacers 160 and 170 have a structure capable of dispersing the folding stress, the upper surfaces thereof may have a diamond shape, a polygonal shape, a rectangular shape, or another type of shape.

Since the dual-function spacers 160 and 170 disposed in the folding area FA have a structure capable of dispersing, reducing, or minimizing the folding stress, the occurrence of a crack can be suppressed when the foldable display device 100 is folded. Therefore, the foldable display device 100 can be improved in easiness in folding.

Further, since the occurrence of a crack in the dual-function spacers 160 and 170 disposed in the folding area FA is suppressed, the generation of a particle caused by a crack in a spacer can be reduced or minimized. The particle generated by a crack in a spacer may penetrate into the organic light-emitting layer 132 and cause a change in height of the organic light-emitting layer 132. Further, the particle generated by a crack in a spacer may give a stimulus to the organic light-emitting layer 132 and crack the organic light-emitting layer 132. If the organic light-emitting layer 132 is changed in height or cracked, a dark spot may be generated in the foldable display device 100. The dark spot may be a defect of the foldable display device 100. Therefore, the dual-function spacers 160 and 170 in which the occurrence of a crack is suppressed by a decrease in folding stress can reduced or minimize the generation of a particle. Accordingly, a change in height of the organic light-emitting layer 132 or a crack in the organic light-emitting layer 132 due to a particle can be reduced or minimized. Therefore, the generation of a dark spot can be suppressed, and thus, a decrease in brightness of the foldable display device 100 can be suppressed.

In this case, the area size of the spacers 150, 160, and 170 may account for, for example, 0.25% to 1.25% of the total area size of the active area AA of the foldable display device 100. The area size of the spacers 150, 160, and 170 may be determined in consideration of various factors such as the size of a pixel, the placement of a TFT, the placement of a spacer, and a process.

Specifically, the area size of the spacer 150 disposed in the non-folding area NFA may account for, for example, 0.45% to 0.5% of the total area size of the active area AA. The area size of the spacers 160 and 170 disposed in the folding area FA may account for, for example, 0.45% to 1% of the total area size of the active area AA. Herein, the dual-function spacers 160 and 170 disposed in the folding area FA may have a greater area size than the spacer 150 disposed in the non-folding area NFA in consideration of a folding stress applied to the dual-function spacers 160 and 170 when the foldable display device 100 is folded.

In some embodiments, each or some pixels of the foldable display device 100 may have a different size. Therefore, the dual-function spacers 160 and 170 disposed adjacent to a pixel may be formed in consideration of the size of the pixel. A pixel may include a plurality of sub-pixels, and each sub-pixel may correspond to at least one of the dual-function spacers 160 and 170. In this case, the size of the corresponding dual-function spacers 160 and 170 may vary depending on the size of each sub-pixel. As the size of the dual-function spacers 160 and 170 is decreased, an adjacent pixel may be formed to have a greater size. Thus, the brightness of the foldable display device 100 can be improved, e.g., because the brightness is proportional to the size of the pixels. Therefore, the dual-function spacers 160 and 170 may be disposed in the folding area FA by increasing the density (or number) of the dual-function spacers 160 and 170 having a small size in an area for the dual-function spacers 160 and 170. That is, the density of the dual-function spacers 160 and 170 may be increased by forming a plurality of smaller dual-function spacers 160 and 170 rather than single dual-function spacers 160 and 170 in the same area. Therefore, a folding stress applied to the dual-function spacers 160 and 170 can be reduced or minimized and a sub-pixel adjacent to the dual-function spacers 160 and 170 may be formed to have a greater size. Accordingly, the brightness of the foldable display device 100 can be improved.

Herein, the dual-function spacer 160 may be formed of, for example, acryl-based materials, polyimide, polyamide, carbon compounds, or a silicone-based material, but may not be limited thereto.

Further, the dual-function spacers 160 and 170 positioned on the bank 107 may be positioned in the contact hole included in the planarization layer 105. A part of the anode electrode 131 may be positioned in the contact hole included in the planarization layer 105 so as to be electrically connected to the thin film transistor 120. When the foldable display device 100 is folded, light emitted from the organic light-emitting layer 132 may be irregularly reflected by the part of the anode electrode 131 positioned in the contact hole. Therefore, the contact hole of the foldable display device 100 may be visible, or a dark spot may be generated in a pixel due to light interference. In this case, a part of the dual-function spacers 160 and 170 may be overlapped with the contact hole included in the planarization layer 105.

Further, the part of the dual-function spacers 160 and 170 may also be overlapped with the part of the anode electrode 131 positioned in the contact hole. Therefore, the dual-function spacers 160 and 170 can reduce or minimize the reflection within the panel by shielding the contact hole. In this case, the single dual-function spacers 160 and 170 can shield not only a contact hole but also another contact hole present in an adjacent pixel. That is, the single dual-function spacers 160 and 170 can shield a plurality of contact holes.

Accordingly, it is possible to reduce or minimize the visibility of the contact hole of the foldable display device 100 and the generation of a dark spot caused by light interference. Therefore, it is possible to improve the efficiency of suppressing a decrease in brightness of the foldable display device 100.

Herein, the dual-function spacers 160 and 170 disposed in the folding area FA may include a spacer stabilization structure. Hereinafter, the spacer stabilization structure will be described with reference to FIG. 3.

Figure 3:
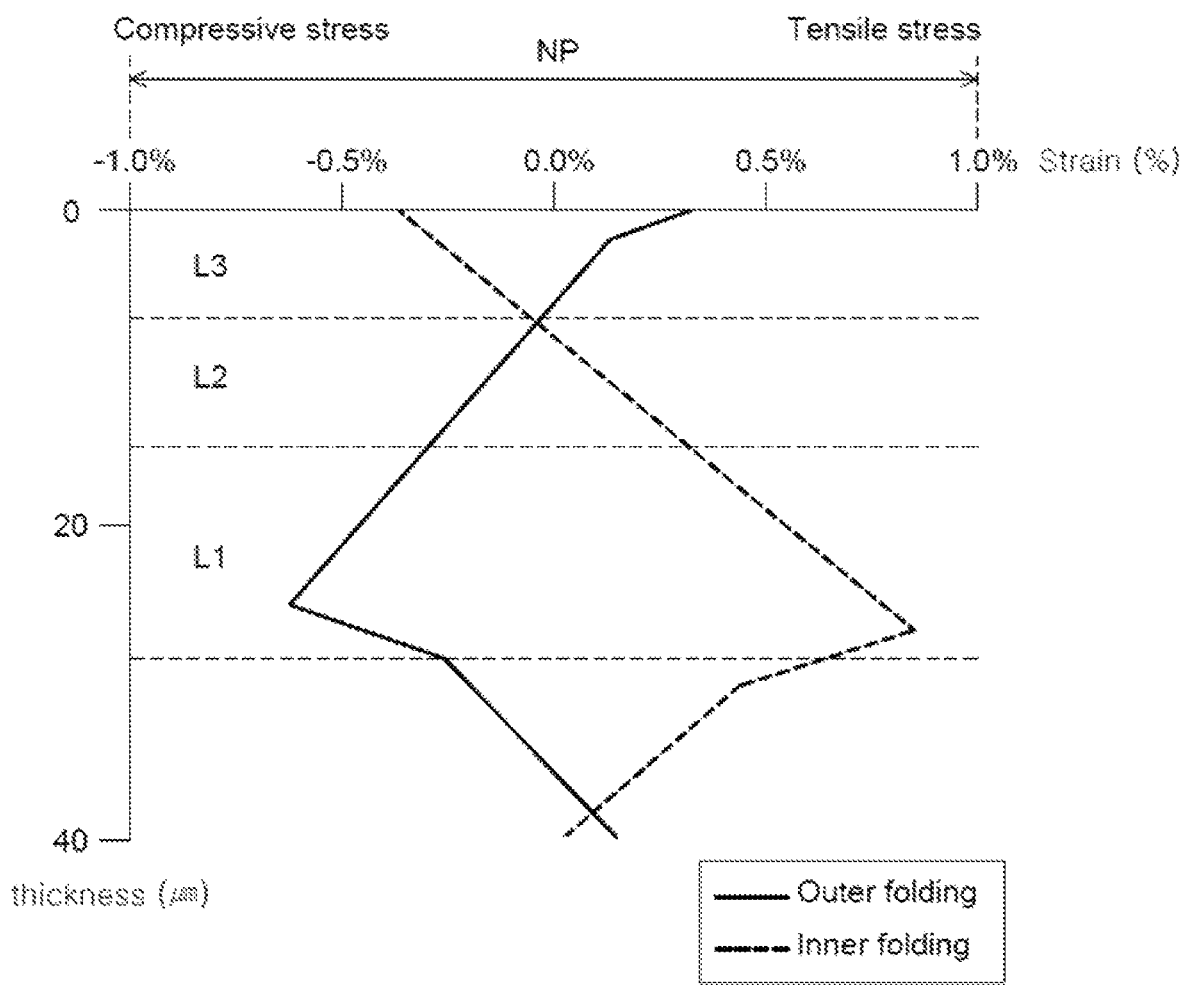
FIG. 3 is a graph illustrating folding stress applied to a foldable display device according to an exemplary embodiment of the present disclosure.

FIG. 3 is a graph illustrating folding stress applied to the foldable display device 100 according to an exemplary embodiment of the present disclosure. FIG. 3 illustrates a compressive force and a tensile force applied to layers disposed on and under a neutral plane when the foldable display device is folded. An X-axis in the graph of FIG. 3 represents a strain (%) and a Y-axis represents a thickness (μm) of the foldable display device.

For convenience in explanation, FIG. 3 illustrates a substrate L1, a thin film transistor L2, and an encapsulation unit L3 laminated in sequence. Other components may be disposed between the above-described structures.

The inner folding lines (e.g., in-folding graph) of FIG. 3 illustrate a folding stress applied when the foldable display device 100 is in-folded and image display units face each other. In this case, the image display units may be positioned between the thin film transistor L2 and the encapsulation unit L3. Further, the outer folding lines (e.g., out-folding graph) illustrate a folding stress applied when the foldable display device 100 is out-folded and substrate supporting units face each other. In this case, the substrate supporting units may be positioned under the substrate L1.

A neutral plane NP refers to a virtual plane to which a stress is not applied since a compressive force and a tensile force applied to the foldable display device 100 offset each other when the foldable display device 100 is folded. Therefore, the strain is 0% on the neutral plane NP.

When the foldable display device 100 is in-folded, the neutral plane NP of the in-folding graph may be positioned on the thin film transistor L2. In this case, a part of the thin film transistor L2 and the substrate L1 positioned under the thin film transistor L2 are stretched and thus may be applied with a tensile force. Further, the other components and the encapsulation unit L3 disposed on the thin film transistor L2 are compressed and thus may be applied with a compressive force.

Further, when the foldable display device 100 is out-folded, the neutral plane NP of the out-folding graph may be positioned on the thin film transistor L2. In this case, a part of the thin film transistor L2 and the substrate L1 positioned under the thin film transistor L2 are compressed and thus may be applied with a compressive force. Further, the other components and the encapsulation unit L3 disposed on the thin film transistor L2 are stretched and thus may be applied with a tensile force.

When the foldable display device 100 is folded, the tensile force and/or compressive force applied to the components in the folding area FA become a folding stress. Thus, the components disposed in the folding area FA can be cracked. Therefore, it is necessary to design the components disposed in the folding area FA in order to reduce or minimize the folding stress applied to the components disposed in the folding area FA.

Accordingly, as illustrated in FIG. 2A to FIG. 2C, the dual-function spacers 160 and 170 positioned in the folding area FA may have a spacer stabilization structure. In the spacer stabilization structure, the dual-function spacers 160 and 170 having different area sizes from each other are disposed in a direction intersecting with (e.g., perpendicular to) the folding axis. Herein, the area size of the dual-function spacers 160 and 170 may be decreased or increased based on a distance to the folding axis of the folding area FA. In some embodiments, the area size of the dual-function spacers 160 and 170 may be changed consecutively.

Hereinafter, the spacer stabilization structure of the foldable display device 100 will be described in more detail with reference to FIG. 4 to FIG. 7.

Figure 4:
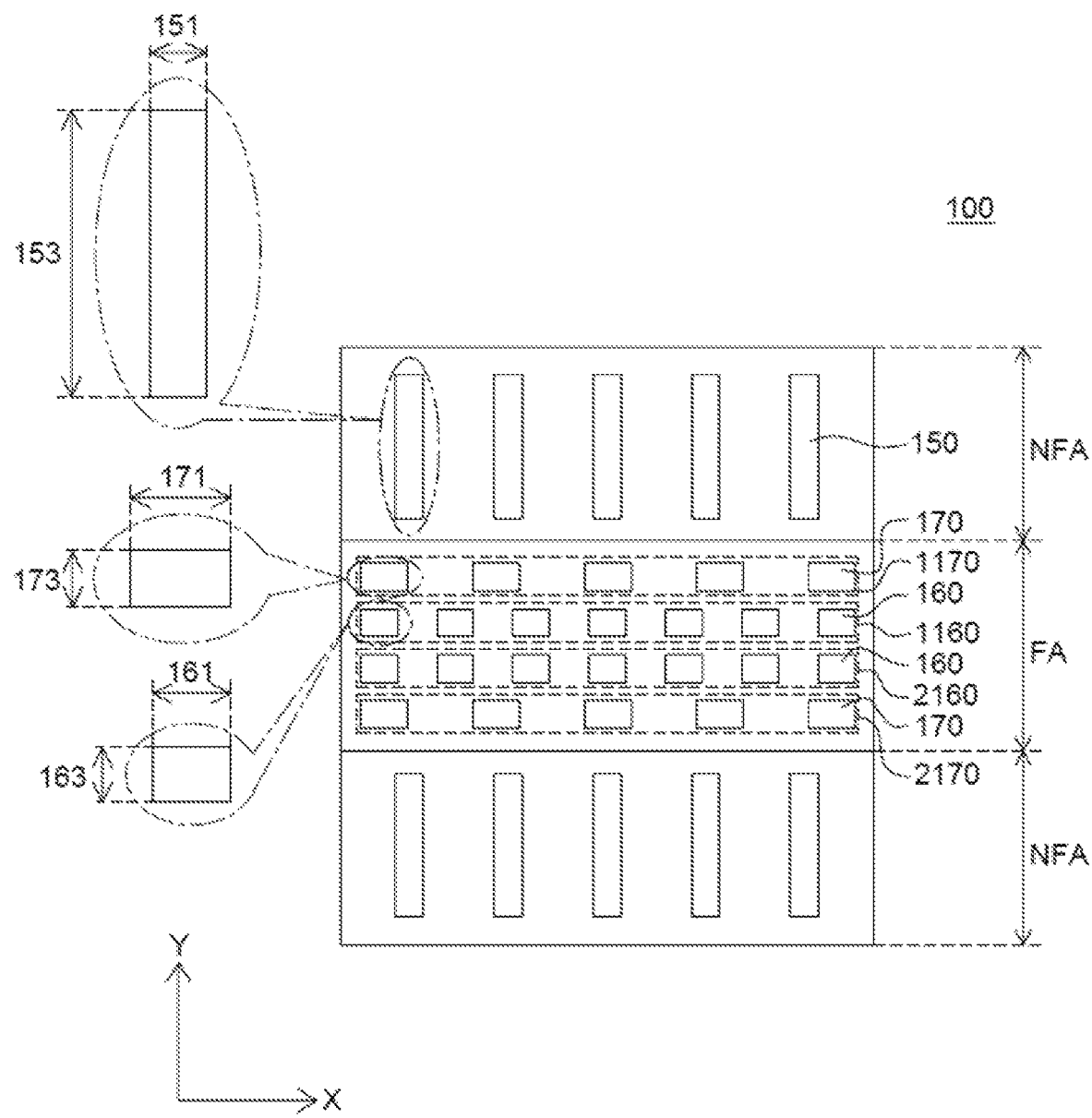
FIG. 4 is a plan view illustrating the placement of a spacer in a foldable display device according to an exemplary embodiment of the present disclosure.
Figure 5:
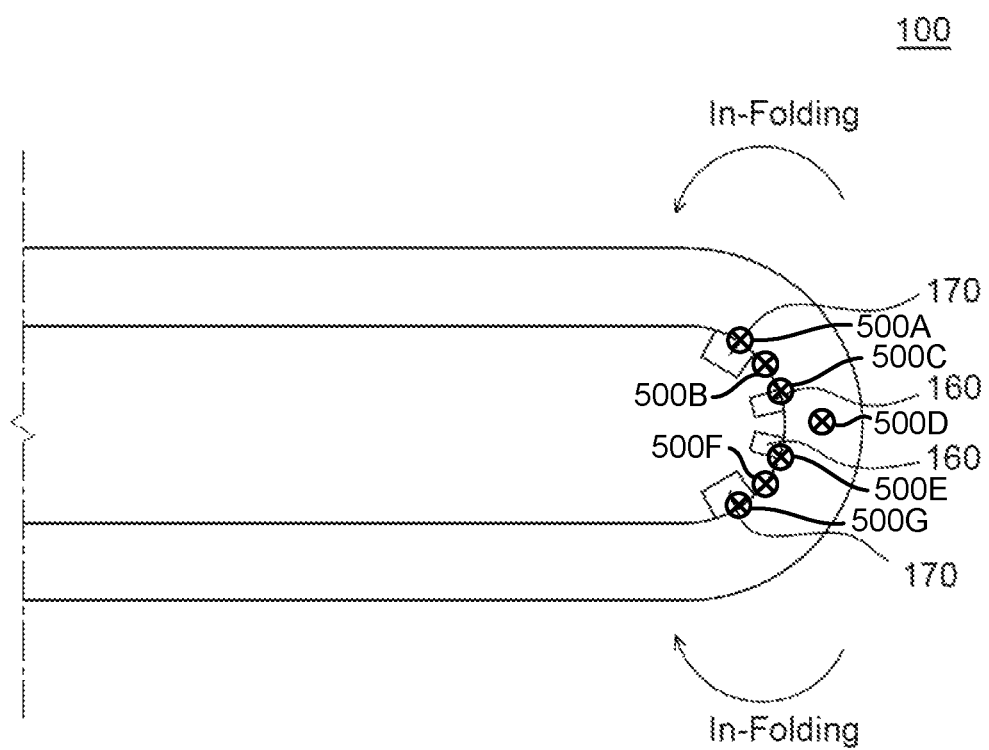
FIG. 5 is a cross-sectional view of the foldable display device shown in FIG. 4 when folded, according to an embodiment
Figure 6:
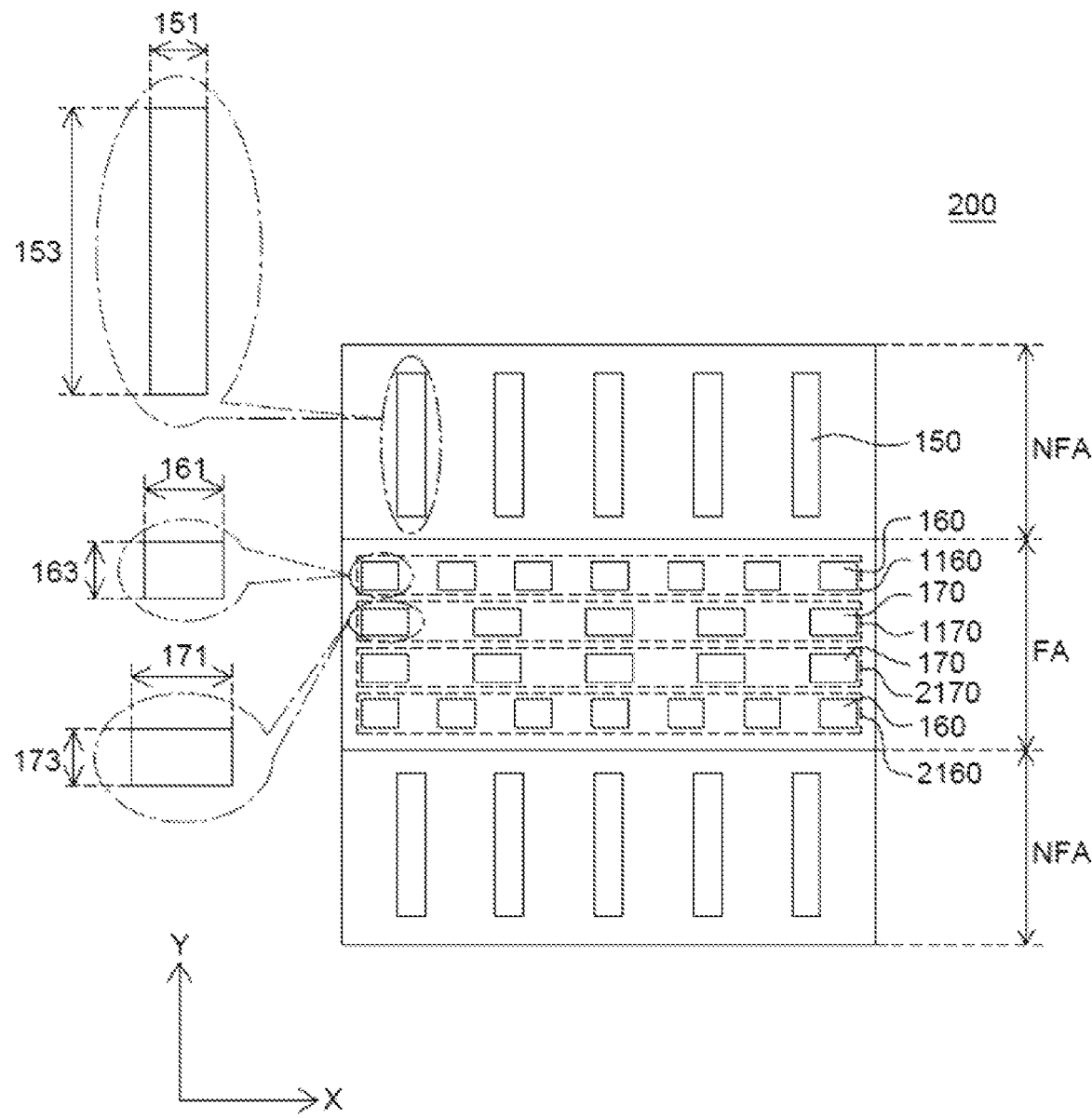
FIG. 6 is a plan view illustrating the placement of a spacer in a foldable display device according to another exemplary embodiment of the present disclosure.
Figure 7:
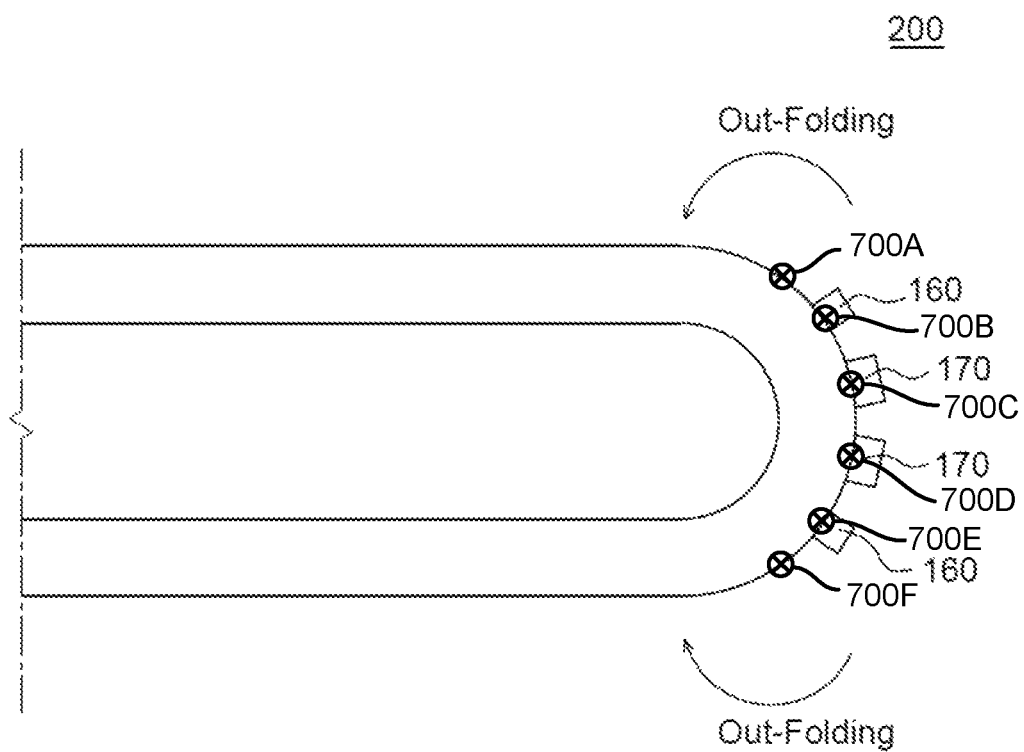
FIG. 7 is a cross-sectional view of the foldable display device shown in FIG. 6 when folded, according to an embodiment

FIG. 4 and FIG. 6 are plan views illustrating the placement of a spacer in a foldable display device according to exemplary embodiments of the present disclosure. FIG. 4 and FIG. 6 are plan views illustrating the structure and the placement of a spacer included in the foldable display device 100 and 200, respectively. FIG. 5 is a cross-sectional view of the foldable display device 100 shown in FIG. 4 when folded, according to an embodiment. FIG. 5 is a cross-sectional view illustrating the placement of a spacer when the foldable display device 100 is in-folded. FIG. 7 is a cross-sectional view of the foldable display device 200 shown in FIG. 6 when folded, according to an embodiment. FIG. 7 is a cross-sectional view illustrating the placement of a spacer when the foldable display device is out-folded. Since the configurations, positions, and materials of the other components are the same as those of the other components in the above-described foldable display devices according to the present disclosure, the redundant description thereof will be omitted.

As illustrated in FIG. 4 and FIG. 5, the foldable display device 100 can be in-folded (or inward folded) around a folding axis of the folding area FA. The direction of the folding axis herein may refer to any virtual line in the folding area FA of the foldable display device 100 that has a direction substantially perpendicular to a plane including any one of the radii of curvature of the folding area FA.

As shown in FIG. 5, example folding axes may include any one of virtual lines 500A, 500B, 500C, 500D, 500E, 500F, and 500G. A folding axis may overlap with some of the spacers but does not necessarily need to overlap with the spacers. For instance, folding axes 500A, 500C, 500E, and 500G overlap with the dual-function spacers 160 and 170, while folding axes 500B, 500D, and 500F do not overlap with the spacers. In some embodiments, the folding area FA may include multiple folding axis, for example, for inward folding, outward folding, or S-folding. Folding axis may be on an inner surface of the foldable display device 100 (as shown in FIG. 5), an outer surface (as shown in FIG. 7), or in between the inner surface and outer surface, for example, folding axis 500D illustrated in FIG. 5.

In this case, the organic light-emitting layers positioned on the thin film transistor 120 of the foldable display device 100 may face each other. Therefore, the image display units of the foldable display device 100 may face each other. Accordingly, the dual-function spacers 160 and 170 on the thin film transistor 120 are positioned on the neutral plane and thus may be compressed and applied with a compressive force.

Further, a compressive force applied to the dual-function spacers 160 and 170 when the foldable display device 100 is in-folded may be increased based on a distance from the folding axis in the Y-axis direction. That is, a folding stress applied to the dual-function spacers 160 and 170 may be increased as the distance of the dual-function spacers 160 and 170 from the folding axis in the Y-axis direction increases.

Herein, as the area size of the single dual-function spacers 160 and 170 is increased, a folding stress to be dispersed by the single dual-function spacers 160 and 170 may be increased. Therefore, the dual-function spacers 160 and 170 disposed in an area applied with folding stress (e.g., greater than stress on other areas) can reduce or minimize a folding stress by increasing the area size of the single dual-function spacers 160 and 170.

When the foldable display device 100 is in-folded, a folding stress applied to the dual-function spacers 160 and 170 is increased as the spacers 160 and 170 are positioned further from the folding axis in the Y-axis direction. Therefore, in the foldable display device 100, the size of the dual-function spacer 160 is smaller than the size of the dual-function spacer 170, which is further from the folding axis than is the dual-function spacer 160. Thus, a folding stress can be reduced or minimized.

In the embodiment of FIG. 4, the dual-function spacers 160 and 170 can be divided into the first dual-function spacer 160 and the second dual-function spacer 170.

The first dual-function spacer 160 positioned in the folding area FA may have a first width 161 and a second width 163 shorter in length than the first width 161. Further, the second dual-function spacer 170 positioned in the folding area FA may have a third width 171 and a fourth width 173 shorter in length than the third width 171. Herein, the first width 161 and the third width 171 may be in the same direction as the extension direction of the folding axis (e.g., the x-axis).

Further, the first width 161 of the first dual-function spacer 160 is shorter in length than the third width 171 of the second dual-function spacer 170. Furthermore, the second width 163 of the first dual-function spacer 160 is shorter in length than the fourth width 173 of the second dual-function spacer 170.

Therefore, the area size of the first dual-function spacer 160 in the folding area FA may be smaller than the area size of the second dual-function spacer 170. Herein, a plurality of first dual-function spacers 160 may form a first column (or row) 1160 as spaced apart from each other with a specific distance in the X-axis direction. Further, a plurality of second dual-function spacers 170 may form a second column (or row) 1170 as spaced apart from each other with a specific distance in the X-axis direction.

The folding area FA further includes a third column 2160 composed of a plurality of spacers having the same size and configuration as the first dual-function spacers 160 included in the first column (or row) 1160. Also, the folding area FA includes a fourth column 2170 composed of a plurality of spacers having the same size and configuration as the second dual-function spacers 170 included in the second column (or row) 1170.

The spacer stabilization structure composed of the first dual-function spacers 160 and the second dual-function spacers 170 may be disposed such that the first column 1160 composed of the plurality of first dual-function spacers 160 is adjacent to the folding axis. Further, in the spacer stabilization structure, the second column 1170 composed of the plurality of second dual-function spacers 170 may be farther from the folding axis than is the first column 1160 composed of the plurality of first dual-function spacers 160.

In this case, in the folding area FA, the first column 1160 and the third column 2160 may be disposed adjacent to each other and between the second column 1170 and the fourth column 2170.

That is, the foldable display device 100 capable of in-folding may include the spacer stabilization structure in which the area size of the dual-function spacers 160 and 170 decrease as the dual-function spacers 160 and 170 are positioned closer to the folding axis. Therefore, when the foldable display device 100 is in-folded, the spacer stabilization structure may disperse a folding stress, and thus, the folding stress applied to the dual-function spacers 160 and 170 can be reduced or minimized. Accordingly, when the foldable display device 100 is in-folded, the occurrence of a crack in the dual-function spacers 160 and 170 can be suppressed. Therefore, the foldable display device 100 can be improved in easiness in folding.

Further, when the foldable display device 100 is in-folded, the occurrence of a crack in the first dual-function spacer 160 or the second dual-function spacer 170 disposed as the spacer stabilization structure in the folding area FA is suppressed. Thus, it is possible to reduce or minimize the generation of a particle caused by a crack in the first dual-function spacer 160 or the second dual-function spacer 170 in the folding area FA.

Accordingly, a change in height of the organic light-emitting layer 132 or a crack in the organic light-emitting layer 132 caused by a particle can be reduced or minimized. Therefore, the generation of a dark spot can be suppressed, and thus, a decrease in brightness of the foldable display device 100 can be suppressed.

As shown in FIG. 4, the spacer 150 disposed in the non-folding area NFA may have a seventh width 151 and an eighth width 153 longer in length than the seventh width 151. In this case, the eighth width 153 is longer in length than the third width 171 of the second dual-function spacer 170.

As illustrated in FIG. 6 and FIG. 7, the foldable display device 200 can be out-folded around a folding axis of the folding area FA. As shown in FIG. 7, example folding axes may include any one of virtual lines 700A, 700B, 700C, 700D, 700E, and 700F. In this case, back surfaces of the substrates positioned under the thin film transistor 120 of the foldable display device 100 may face each other. Therefore, substrate supporting units of the foldable display device 200 may face each other. Accordingly, the dual-function spacers 160 and 170 on the thin film transistor 120 are positioned on the neutral plane and thus may be stretched and applied with a tensile force.

Further, a tensile force applied to the dual-function spacers 160 and 170 when the foldable display device 200 is out-folded may be based on distance from the folding axis in the Y-axis direction. That is, a folding stress applied to the dual-function spacers 160 and 170 may increase as the distance of the dual-function spacers 160 and 170 to the folding axis decreases.

Herein, as the area size of the single dual-function spacers 160 and 170 is increased, a folding stress to be dispersed by the dual-function spacers 160 and 170 may be increased.

Therefore, the dual-function spacers 160 and 170 disposed in an area applied with a folding stress (e.g., greater than stress in other areas) can reduce minimize a folding stress by increasing the area size of the single dual-function spacers 160 and 170.

When the foldable display device 200 is out-folded, a folding stress applied to the dual-function spacers 160 and 170 is increased as the dual-function spacers 160 and 170 are positioned closer to the folding axis in the Y-axis direction. Therefore, in the foldable display device 200, the size of the dual-function spacer 170 adjacent to the folding axis is greater than the size of the dual-function spacer 160, which is further from the folding axis than is the dual-function spacer 170. Thus, a folding stress can be reduced or minimized.

In the embodiment of FIG. 6, the dual-function spacers 160 and 170 may include the first dual-function spacer 160 and the second dual-function spacer 170.

The first dual-function spacer 160 positioned in the folding area FA may have the first width 161 and the second width 163 shorter in length than the first width 161. Further, the second dual-function spacer 170 positioned in the folding area FA may have the third width 171 and the fourth width 173 shorter in length than the third width 171. Herein, the first width 161 and the third width 171 may be in the same direction as the extension direction of the folding axis.

Further, the first width 161 of the first dual-function spacer 160 is shorter in length than the third width 171 of the second dual-function spacer 170. Furthermore, the second width 163 of the first dual-function spacer 160 is shorter in length than the fourth width 173 of the second dual-function spacer 170. Therefore, the area size of the first dual-function spacer 160 in the folding area FA may be smaller than the area size of the second dual-function spacer 170.

Herein, a plurality of first dual-function spacers 160 may form the first column (or row) 1160 as spaced apart from each other with a specific distance in the X-axis direction. Further, a plurality of second dual-function spacers 170 may form the second column (or row) 1170 as spaced apart from each other with a specific distance in the X-axis direction.

The folding area FA further includes the third column 2160 composed of a plurality of spacers having the same size and configuration as the first dual-function spacers 160 included in the first column (or row) 1160. Also, the folding area FA includes the fourth column 2170 composed of a plurality of spacers having the same size and configuration as the second dual-function spacers 170 included in the second column (or row) 1170.

The spacer stabilization structure composed of the first dual-function spacers 160 and the second dual-function spacers 170 may be disposed such that the second column composed of the plurality of second dual-function spacers 170 is adjacent to the folding axis. Further, in the spacer stabilization structure, the first column composed of the plurality of first dual-function spacers 160 may be farther from the folding axis than is the second column composed of the plurality of second dual-function spacers 170.

In this case, in the folding area FA, the second column 1170 and the fourth column 2170 may be disposed adjacent to each other and between the first column 1160 and the third column 2160.

That is, the foldable display device 200 capable of out-folding may include the spacer stabilization structure in which the area size of the dual-function spacers 160 and 170 increase as the dual-function spacers 160 and 170 are positioned closer to the folding axis. Therefore, when the foldable display device 200 is out-folded, the spacer stabilization structure may disperse a folding stress, and, thus, the folding stress applied to the dual-function spacers 160 and 170 can be reduced or minimized.

Accordingly, when the foldable display device 200 is out-folded, the occurrence of a crack in the dual-function spacers 160 and 170 can be suppressed. Therefore, the foldable display device 200 can be improved in easiness in folding.

Further, when the foldable display device 200 is out-folded, the occurrence of a crack in the first dual-function spacer 160 or the second dual-function spacer 170 disposed as the spacer stabilization structure in the folding area FA is suppressed. Thus, it is possible to reduce or minimize the generation of a particle caused by a crack in the first dual-function spacer 160 or the second dual-function spacer 170 in the folding area FA. Accordingly, a change in height of the organic light-emitting layer 132 or a crack in the organic light-emitting layer 132 caused by a particle can be reduced or minimized. Therefore, the generation of a dark spot can be suppressed, and thus, a decrease in brightness of the foldable display device 200 can be suppressed.

As shown in FIG. 6, the spacer 150 disposed in the non-folding area NFA may have the seventh width 151 and the eighth width 153 longer in length than the seventh width 151. In this case, the eighth width 153 is longer in length than the third width 171 of the second dual-function spacer 170.

Figure 8:
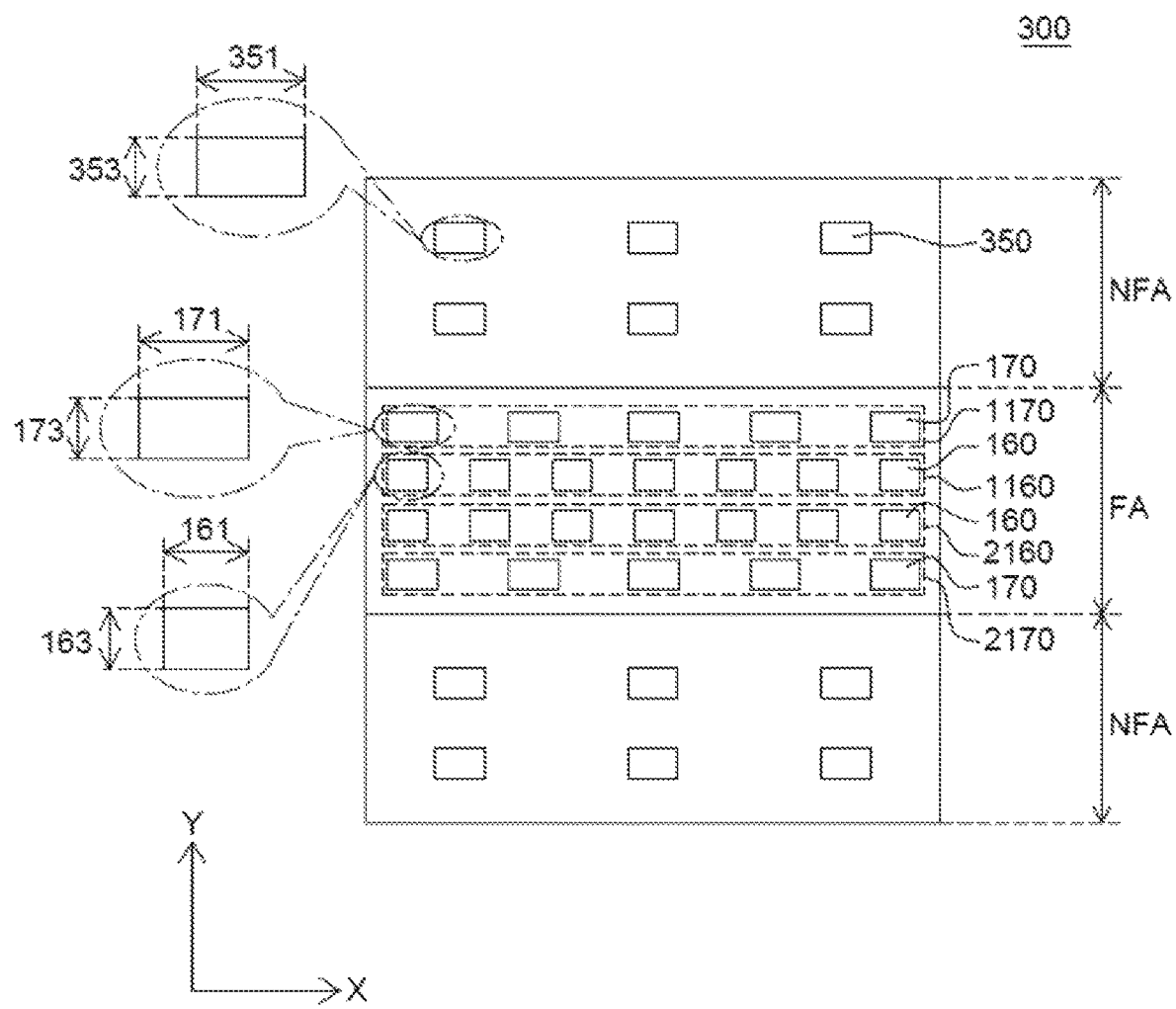
FIG. 8 is a plan view illustrating the placement of a spacer in a foldable display device according to yet another exemplary embodiment of the present disclosure.
Figure 9:
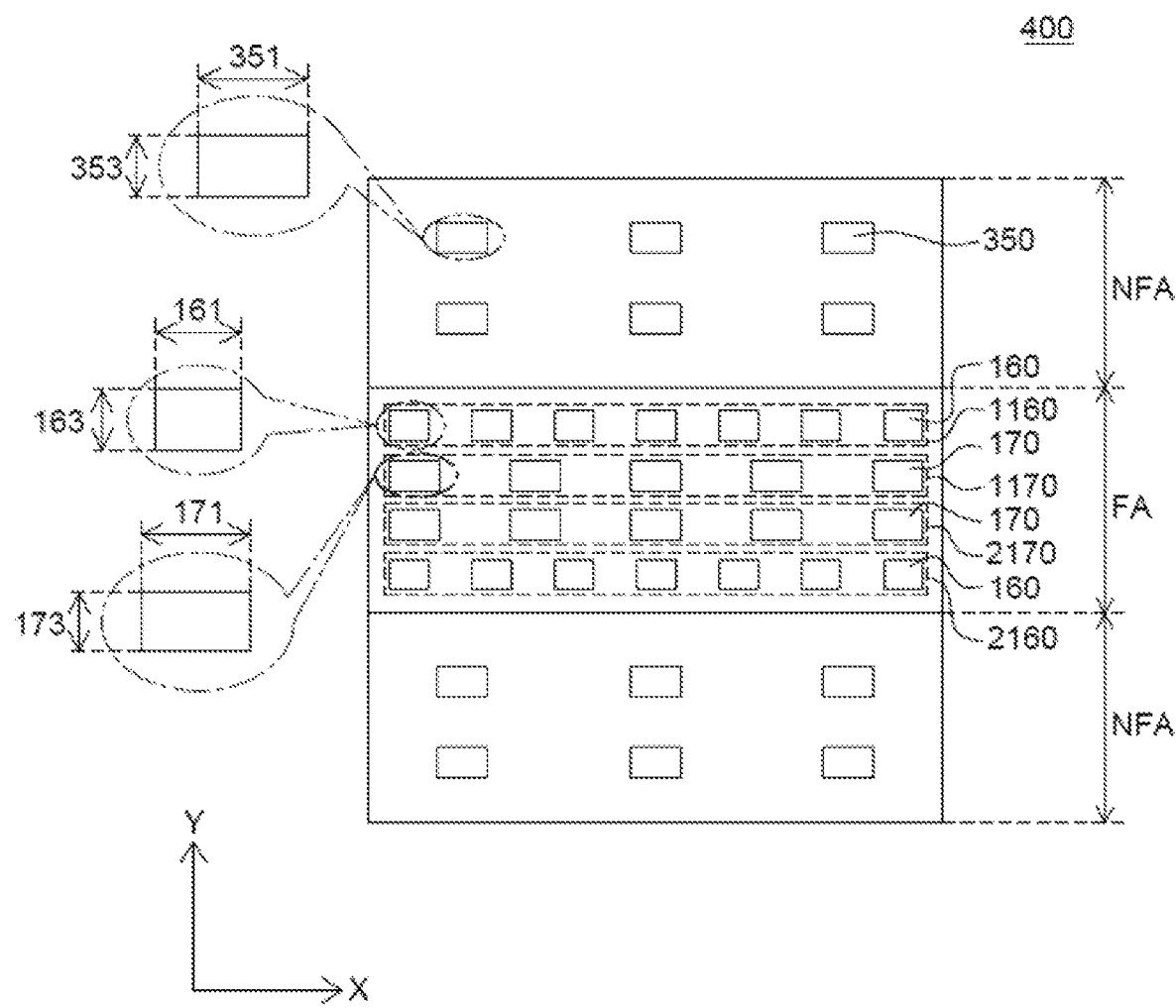
FIG. 9 is a plan view illustrating the placement of a spacer in a foldable display device according to still another exemplary embodiment of the present disclosure.
Figure 10:
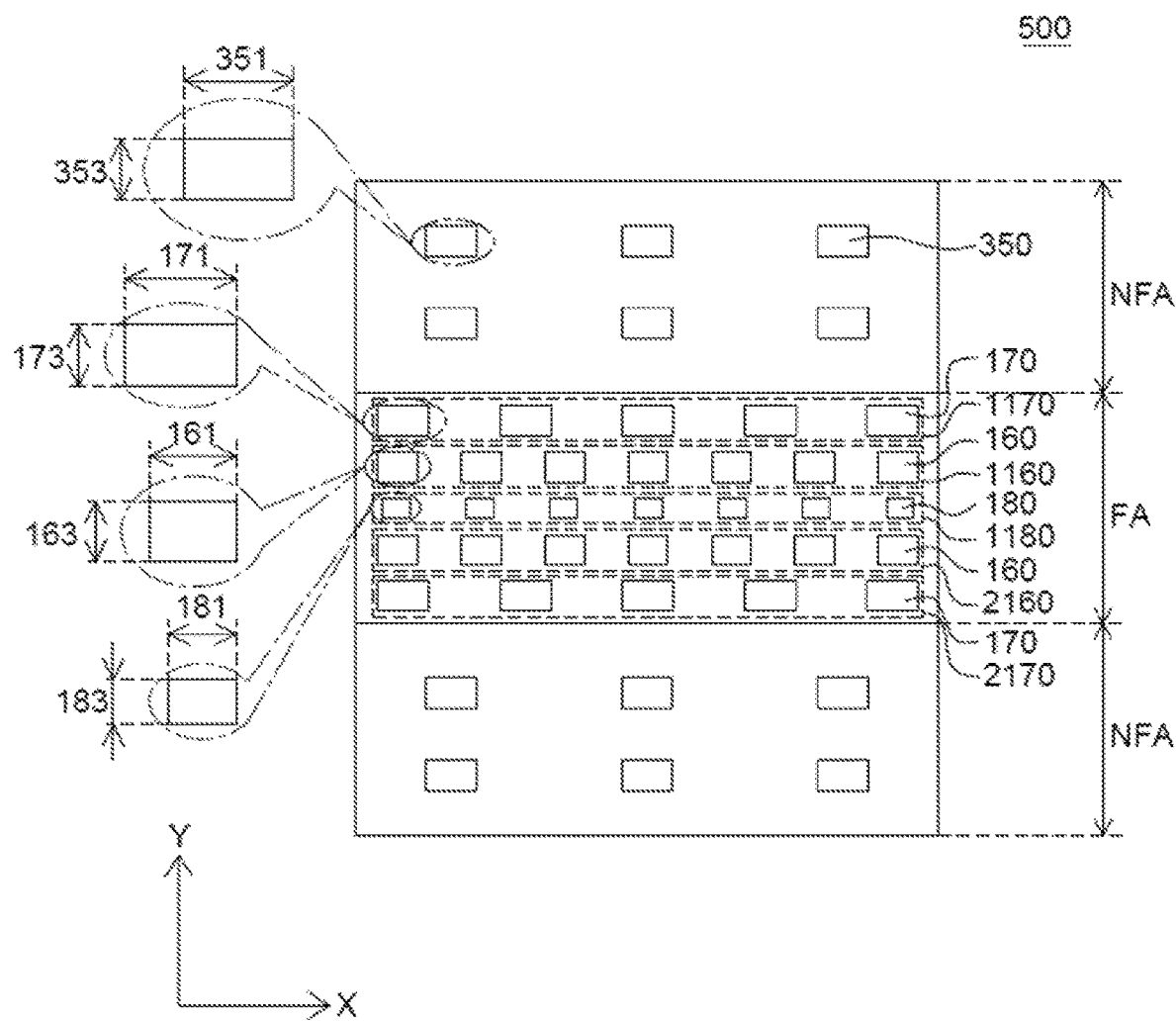
FIG. 10 is a plan view illustrating the placement of a spacer in a foldable display device according to still another exemplary embodiment of the present disclosure.
Figure 11:
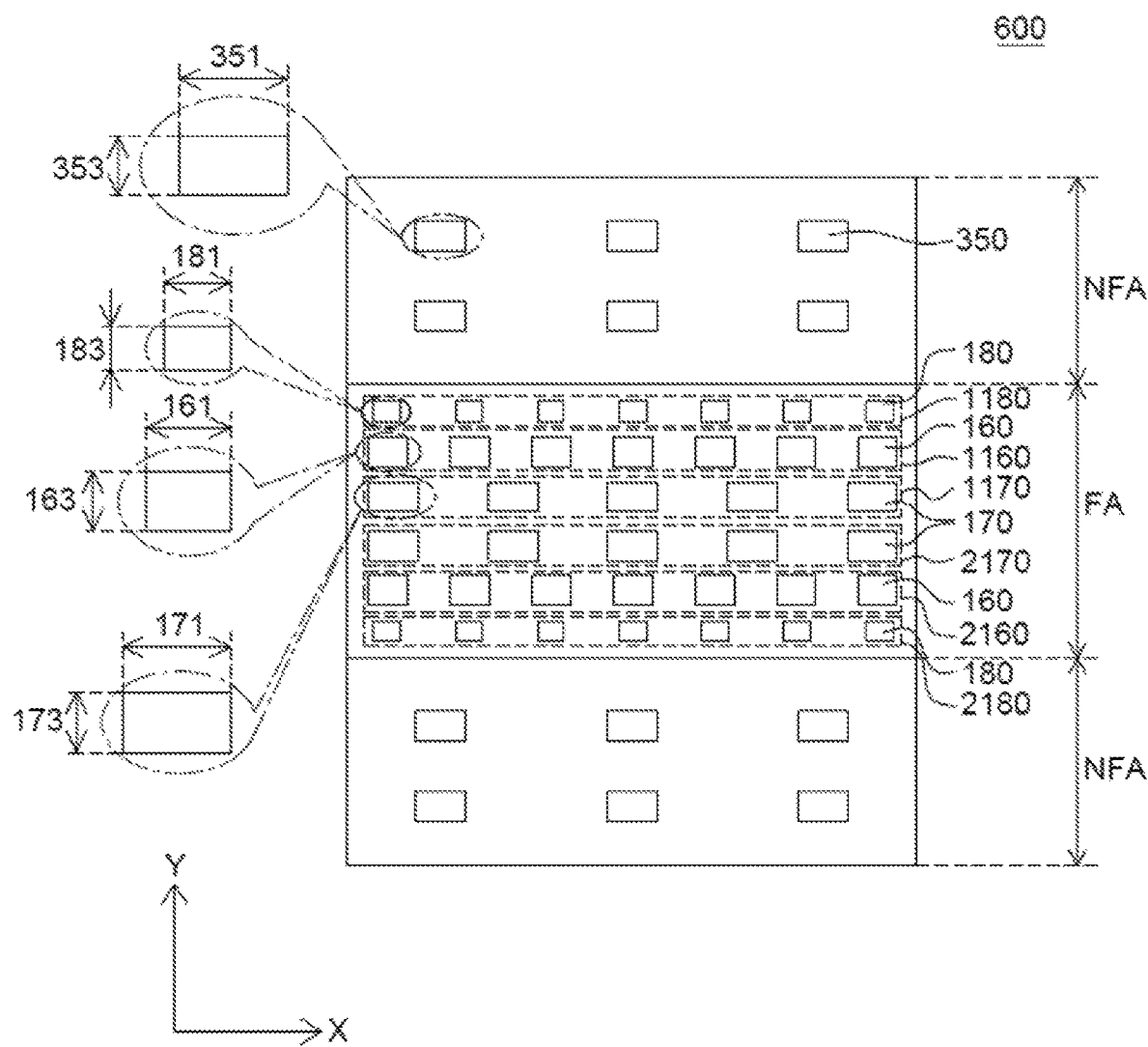
FIG. 11 is a plan view illustrating the placement of a spacer in a foldable display device according to still another exemplary embodiment of the present disclosure.

FIG. 8 to FIG. 11 are plan views illustrating the placement of a spacer in a foldable display device according to other exemplary embodiments of the present disclosure. FIG. 8 and FIG. 9 are different from FIG. 4 in the structure and the placement of a spacer included in a foldable display device. Further, FIG. 10 and FIG. 11 are different from FIG. 6 in the structure and the placement of a spacer included in a foldable display device. Therefore, the redundant description of the other same components will be omitted.

FIG. 8 is different from FIG. 4 in the structure of a spacer 350 disposed in the non-folding area NFA of a foldable display device 300. FIG. 9 is different from FIG. 6 in the structure of the spacer 350 disposed in the non-folding area NFA of a foldable display device 400. Herein, the spacer 350 disposed in the non-folding area NFA of the foldable display device 300 illustrated in FIG. 8 has the same structure as the spacer 350 disposed in the non-folding area NFA of the foldable display device 400 illustrated in FIG. 9. FIG. 8 is different from FIG. 9 in the structure and the placement of spacers disposed in the folding area FA of the foldable display devices 300 and 400. Therefore, the redundant description of the other same components will be omitted.

As illustrated in FIG. 8 and FIG. 9, the spacer 350 disposed in the non-folding area NFA of the foldable display devices 300 and 400 may have the same shape as the second dual-function spacer 170 disposed in the folding area FA.

Specifically, the third width 171 of the second dual-function spacer 170 may be equal to a seventh width 351 of the spacer 350 disposed in the folding area FA. The fourth width 173 of the second dual-function spacer 170 may be equal to an eighth width 353 of the spacer 350 disposed in the non-folding area NFA. Therefore, the spacer 350 disposed in the non-folding area NFA and the second dual-function spacer 170 may be formed by the same process. Accordingly, a process for forming the spacer 350 in the non-folding area NFA and the second dual-function spacer 170 in the folding area FA can be simplified. Therefore, it is possible to reduce or minimize the generation of a particle caused by a crack in a spacer during repeated processes.

FIG. 10 is the same as FIG. 8 except that a plurality of third dual-function spacers 180 is further included in the folding area FA of a foldable display device 500. Therefore, the redundant description of the other same components will be omitted.

As illustrated in FIG. 10, the third dual-function spacers 180 are positioned in the folding area FA. The third dual-function spacer 180 may have a fifth width 181 and a sixth width 183 shorter in length than the fifth width 181. Herein, the fifth width 181 may be in the same direction as the extension direction of the folding axis.

Further, the fifth width 181 of the third dual-function spacer 180 is shorter in length than the first width 161 of the first dual-function spacer 160 disposed in the folding area FA. Furthermore, the sixth width 183 of the third dual-function spacer 180 is shorter in length than the second width 163 of the first dual-function spacer 160 disposed in the folding area FA. Therefore, the area size of the third dual-function spacer 180 in the folding area FA may be smaller than the area size of the first dual-function spacer 160.

Herein, the plurality of third dual-function spacers 180 may form a fifth column (or row) 1180 as spaced apart from each other with a specific distance in the X-axis direction (e.g., folding axis). In the folding area FA, the fifth column 1180 may be disposed between the first column 1160 and the third column 2160. Therefore, the third column 2160 may be disposed most adjacent to the folding axis (relative to the other columns or rows) or positioned on the folding axis.

Therefore, the foldable display device 500 capable of in-folding may include a spacer stabilization structure in which the dual-function spacers 160, 170, and 180 are decreased in area size as the dual-function spacers 160, 170, and 180 are positioned closer to the folding axis. That is, the dual-function spacers 160, 170, and 180 are placed in a sequence where the area sizes increase as the dual-function spacers 160, 170, and 180 are positioned farther from the folding axis in the Y-axis direction. Thus, when the foldable display device 500 is in-folded, the dispersion of a folding stress increasing in the Y-axis direction can be improved. Therefore, when the foldable display device 500 is in-folded, the spacer stabilization structure may disperse the folding stress, and thus, the folding stress applied to the dual-function spacers 160, 170, and 180 can be reduced or minimized. Accordingly, when the foldable display device 500 is in-folded with a smaller radius of curvature, the occurrence of a crack in the dual-function spacers 160, 170, and 180 can be suppressed. Therefore, the foldable display device 500 can be improved in easiness in folding.

In comparison to FIG. 6, in FIG. 11, a plurality of third dual-function spacers 180 is further included in the folding area FA of a foldable display device 600. Therefore, the redundant description of the other same components will be omitted.

As illustrated in FIG. 11, the third dual-function spacers 180 are positioned in the folding area FA. The third dual-function spacer 180 may have the fifth width 181 and the sixth width 183 shorter in length than the fifth width 181. Herein, the fifth width 181 may be in the same direction as the extension direction of the folding axis.

Further, the fifth width 181 of the third dual-function spacer 180 is shorter in length than the first width 161 of the first dual-function spacer 160 disposed in the folding area FA. Furthermore, the sixth width 183 of the third dual-function spacer 180 is shorter in length than the second width 163 of the first dual-function spacer 160 disposed in the folding area FA. Therefore, the area size of the third dual-function spacer 180 in the folding area FA may be smaller than the area size of the first dual-function spacer 160.

Herein, the plurality of third dual-function spacers 180 may form the fifth column (or row) 1180 as spaced apart from each other with a specific distance in the X-axis direction (e.g., folding axis). Further, the plurality of third dual-function spacers 180 may form a sixth column (or row) 2180 as spaced apart from each other with a specific distance in the X-axis direction.

In the folding area FA, the first column 1160 and the third column 2160 may be disposed between the fifth column 1180 and the sixth column 2180. Therefore, the fifth column 1180 and the sixth column 2180 may be disposed farthest from the folding axis (relative to the other columns or rows).

Therefore, the foldable display device 600 capable of out-folding may include a spacer stabilization structure in which the dual-function spacers 160, 170, and 180 are increased in area size as the dual-function spacers 160, 170, and 180 are positioned closer to the folding axis. That is, the dual-function spacers 160, 170, and 180 are placed in a sequence where the area sizes decrease as the dual-function spacers 160, 170, and 180 are positioned farther from the folding axis in the Y-axis direction. Thus, when the foldable display device 600 is out-folded, the dispersion of a folding stress increasing in the Y-axis direction can be improved. Therefore, when the foldable display device 600 is out-folded, the spacer stabilization structure may disperse the folding stress, and, thus, the folding stress applied to the dual-function spacers 160, 170, and 180 can be reduced or minimized. Accordingly, when the foldable display device 600 is out-folded with a smaller radius of curvature, the occurrence of a crack in the dual-function spacers 160, 170, and 180 can be suppressed. Therefore, the foldable display device 600 can be improved in easiness in folding.

Figure 12:
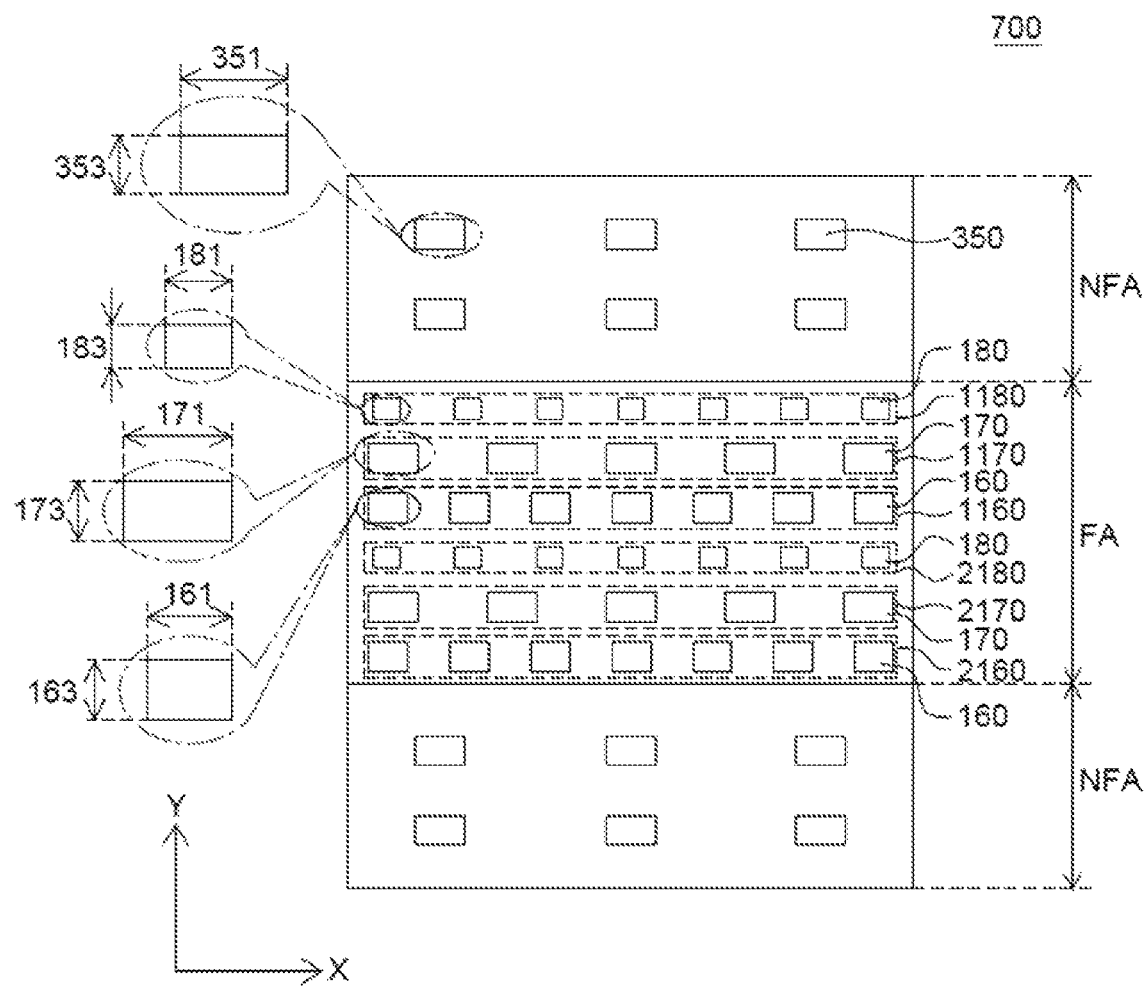
FIG. 12 is a plan view illustrating the placement of a spacer in a foldable display device according to still another exemplary embodiment of the present disclosure.
Figure 13:
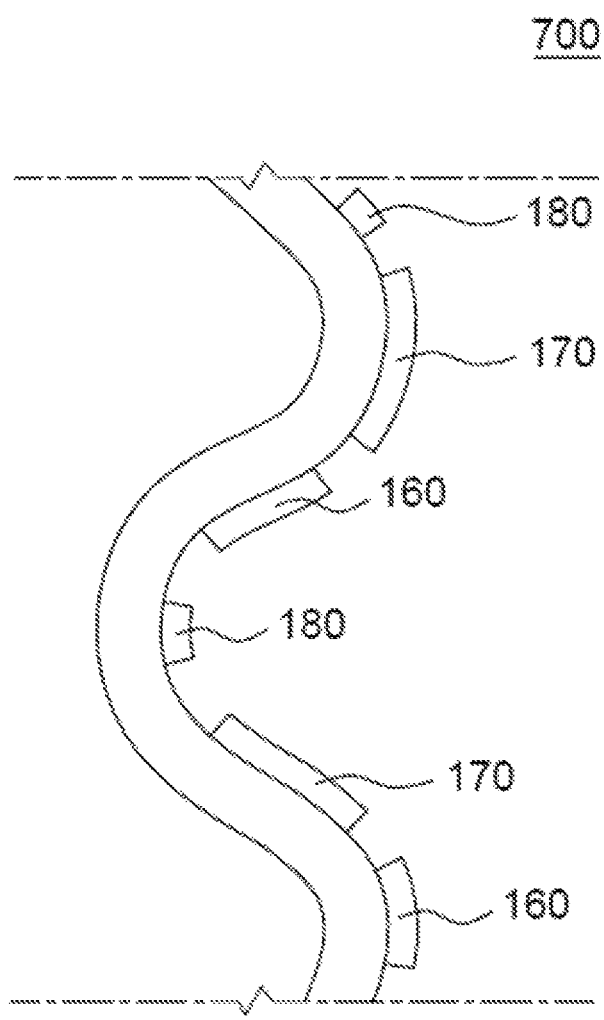
FIG. 13 is a cross-sectional view of the foldable display device shown in FIG. 12 when folded, according to an embodiment.

FIG. 12 is a plan view illustrating the placement of a spacer in a foldable display device according to still another exemplary embodiment of the present disclosure. FIG. 13 is a cross-sectional view of the foldable display device shown in FIG. 12 when folded, according to an embodiment. FIG. 13 is a cross-sectional view illustrating the placement of a spacer when a foldable display device 700 illustrated in FIG. 12 is S-folded (e.g., folded with at least two different folding axes to form the shape of an "S"). Further, FIG. 12 and FIG. 13 are the same as FIG. 4 except the structure and the placement of spacers included in the foldable display device 700.

FIG. 12 is the same as FIG. 4 except that the first column 1160, the second column 1170, the third column 2160, and the fourth column 2170 are disposed in a different manner in the folding area FA of the foldable display device 700 and that the plurality of third dual-function spacers 180 is further included. Therefore, the redundant description of the other same components will be omitted.

As illustrated in FIG. 12, the spacer 160 in the first column 1160 has the same size as the spacer 160 in the third column 2160 in the folding area FA. Further, the spacer 170 in the second column 1170 has the same size as the spacer 170 in the fourth column 2170 in the folding area FA. In this case, the first column 1160 may be disposed adjacent to the fourth column 2170. Further, the first column 1160 and the fourth column 2170 may be disposed between the second column 1170 and the third column 2160. Therefore, the first column 1160 (or third column 2160) and the second column 1170 (or fourth column 2170) including the dual-function spacers having different sizes from each other are disposed in an alternating manner with respect to their sizes.

Further, the third dual-function spacers 180 are positioned in the folding area FA. The third dual-function spacer 180 may have the fifth width 181 and the sixth width 183 shorter in length than the fifth width 181. Herein, the fifth width 181 may be in the same direction as the extension direction of the folding axis.

Further, the fifth width 181 of the third dual-function spacer 180 is shorter in length than the first width 161 of the first dual-function spacer 160 disposed in the folding area FA. Furthermore, the sixth width 183 of the third dual-function spacer 180 is shorter in length than the second width 163 of the first dual-function spacer 160 disposed in the folding area FA.

Therefore, the area size of the third dual-function spacer 180 in the folding area FA may be smaller than the area size of the first dual-function spacer 160.

Herein, the plurality of third dual-function spacers 180 may form the fifth column (or row) 1180 and the sixth column (or row) 2180. In the folding area FA, the second column 1170 may be disposed between the fifth column 1180 and the first column 1160. Further, the fourth column 2170 may be disposed between the sixth column 2180 and the third column 2160. Therefore, the fifth column 1180 (or sixth column 2180), the second column 1170 (or fourth column 2170), and the first column 1160 (or third column 2160) including the dual-function spacers having different sizes from each other may be disposed sequentially and consecutively.

Herein, the foldable display device 700 capable of S-folding may include at least two folding axes (e.g., both in the x-axis direction). The second column 1170 and the sixth column 2180 may be disposed most adjacent to, or on, one of the folding axes. Therefore, the foldable display device 700 capable of S-folding can be folded around at least two folding axes.

As illustrated in FIG. 13, the foldable display device 700 can be S-folded. Herein, the foldable display device 700 can be in-folded and out-folded with respect to the folding axes in the folding area FA. In this case, in an in-folded part of the foldable display device 700, the dual-function spacers 160, 170, and 180 may be applied with a compressive force. The compressive force may be increased as distance increases from the folding axis. Further, in an out-folded part of the foldable display device 700, the dual-function spacers 160, 170, and 180 may be applied with a tensile force. The tensile force may be increased as distance decreases to the folding axis.

Therefore, when the foldable display device 700 is in-folded, a folding stress applied to the dual-function spacers 160, 170, and 180 is increased as the dual-function spacers 160, 170, and 180 are positioned farther from the folding axis. Further, when the foldable display device 700 is out-folded, a folding stress applied to the dual-function spacers 160, 170, and 180 is increased as the dual-function spacers 160, 170, and 180 are positioned closer to the folding axis.

In this case, the foldable display device 700 includes a spacer stabilization structure in which the dual-function spacers 160, 170, and 180 are increased in area size as the dual-function spacers 160, 170, and 180 are positioned farther from the folding axis in the in-folded part and also increased in area size as the dual-function spacers 160, 170, and 180 are positioned closer to the folding axis in the out-folded part. Thus, a folding stress can be reduced or minimized.

That is, the foldable display device 700 capable of S-folding may include the spacer stabilization structure in which the dual-function spacers 160, 170, and 180 have different area sizes in the in-folded part and the out-folded part. Thus, it is possible to disperse a folding stress. Therefore, the folding stress applied to the dual-function spacers 160, 170, and 180 can be reduced or minimized. Accordingly, when the foldable display device 700 capable of S-folding is S-folded, the occurrence of a crack in the dual-function spacers 160, 170, and 180 can be suppressed. Therefore, the foldable display device 700 can be improved in easiness in folding.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device comprising:
    a display panel configured to be folded around a folding axis, the display panel including:
        at least one transistor in a folding area, each of the at least one transistor electrically connected to a light emitting element;
        a first plurality of spacers disposed in a non-folding area; and
        a second plurality of spacers disposed in the folding area and on the at least one transistor, the second plurality of spacers having different sizes than the first plurality of spacers, each of the second plurality of spacers having a first dimension and a second dimension greater than the first dimension, the second dimensions of the second plurality of spacers each in a direction of the folding axis, each of the second plurality of spacers does not overlap an area of the light emitting element that emits light.

2. The foldable display device of claim 1, wherein the second dimension of each spacer of the second plurality of spacers is the greatest dimensions of said each spacer.

3. The foldable display device of claim 1, wherein the first dimension of each spacer of the second plurality of spacers is the smallest dimensions of said each spacer, the first dimensions each intersecting the direction of the folding axis.

4. The foldable display device of claim 1, wherein the display panel further comprises:
    a planarization layer on a flexible substrate; and
    a plurality of pixels on the planarization layer, the planarization layer including a contact hole for each of the plurality of pixels, each contact hole overlapping a portion of a corresponding one of the second plurality of spacers.

5. The foldable display device of claim 4, wherein the display panel is an organic light emitting display panel and each of the plurality of pixels comprises:
    an anode connected to a drain electrode of a transistor of a pixel via the contact hole of the pixel, the corresponding one of the second plurality of spacers overlapping the transistor; and
    a cathode overlapping the anode and the corresponding one of the second plurality of spacers.

6. The foldable display device of claim 5, further comprising:
    an insulating layer on anodes of the plurality of pixels, the second plurality of spacers disposed between the insulating layer and cathodes of the plurality of pixels.

7. The foldable display device of claim 6, further comprising:
    an encapsulation unit on the cathodes of the plurality of pixels, the encapsulation unit having a height greater than heights of the first plurality of spacers and the second plurality of spacers.

8. The foldable display device of claim 1, wherein the second plurality of spacers are arranged in a plurality of columns in the direction of the folding axis, each of the plurality of columns including a subset of the second plurality of spacers spaced from each other.

9. The foldable display device of claim 8, wherein at least one of the plurality of columns overlaps the folding axis.

10. The foldable display device of claim 8, wherein the plurality of columns include at least a first column of spacers having a first area and a second column of spacers having a second area greater than the first area.

11. The foldable display device of claim 10, wherein the first column of spacers and the second column of spacers are disposed on a side of the display panel applied with a compressive force responsive to folding of the foldable display device, the folding axis positioned closer to the first column of spacers than to the second column of spacers.

12. The foldable display device of claim 10, wherein the first column of spacers and the second column of spacers are disposed on a side of the display panel applied with a tensile force responsive to folding of the foldable display device, the folding axis positioned closer to the second column of spacers than to the first column of spacers.

13. The foldable display device of claim 10, wherein a third area of the first plurality of spacers equals either the first area or the second area.

14. The foldable display device of claim 10, wherein the plurality of columns further include a third column of spacers having a third area different than each of the first area and the second area.

15. The foldable display device of claim 1, wherein each of the first plurality of spacers has a third dimension and a fourth dimension greater than the third dimension, the fourth dimensions of the first plurality of spacers each intersecting with the direction of the folding axis.

16. The foldable display device of claim 1, wherein the first plurality of spacers and the second plurality of spacers have a trapezoidal cross-section with tapered thickness, a first base angle of the trapezoidal cross-section of the first plurality of spacers smaller than a second base angle of the trapezoidal cross-section of the second plurality of spacers.

17. The foldable display device of claim 1, wherein the display panel is further configured to be folded around another folding axis distinct from the folding axis.

18. A foldable display device comprising:
 a display panel configured to be folded around a folding axis, the display panel including:
  at least one transistor in a folding area, each of the at least one transistor electrically connected to a light emitting element;
  a first plurality of spacers disposed in a non-folding area; and
  a second plurality of spacers disposed in the folding area and on the at least one transistor, a first density of the first plurality of spacers less than a second density of the second plurality of spacers, each of the second plurality of spacers does not overlap an area of the light emitting element that emits light.

19. The foldable display device of claim 18, wherein the second density is at least twice the first density.

20. The foldable display device of claim 18, wherein the display panel further includes:
 a plurality of pixels disposed in an active area, each of the plurality of pixels overlapping with at least one of the first plurality of spacers or the second plurality of spacers.

21. The foldable display device of claim 20, wherein the first plurality of spacers and the second plurality of spacers account for 0.25% to 1.25% of an area of the active area.

22. The foldable display device of claim 21, wherein the first plurality of spacers accounts for 0.45% to 0.5% of the area of the active area.

23. The foldable display device of claim 21, wherein the second plurality of spacers accounts for 0.45% to 1% of the area of the active area.

24. A foldable display device comprising:
 a display panel including:
  at least one transistor in a folding area;
  a first plurality of spacers disposed in a non-folding area;
  a second plurality of spacers disposed in the folding area and on the at least one transistor, the second plurality of spacers having different size or density than the first plurality of spacers;
  a plurality of pixels disposed in an active area, each of the plurality of pixels overlapping with at least one of the first plurality of spacers or the second plurality of spacers, wherein each of the at least one transistor is electrically connected to a corresponding light emitting element of one of the plurality of pixels, each of the second plurality of spacers does not overlap an area of the light emitting element that emits light.

* * * * *